US011115052B2

(12) United States Patent
Jin et al.

(10) Patent No.: US 11,115,052 B2
(45) Date of Patent: *Sep. 7, 2021

(54) INFORMATION PROCESSING METHOD AND COMMUNICATIONS APPARATUS

(71) Applicant: HUAWEI TECHNOLOGIES CO., LTD., Guangdong (CN)

(72) Inventors: Jie Jin, Moscow (RU); Wen Tong, Ottawa (CA); Ivanov Ilya, Moscow (RU); Aleksandr Aleksandrovich Petiushko, Moscow (RU); Chaolong Zhang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/700,301

(22) Filed: Dec. 2, 2019

(65) Prior Publication Data

US 2020/0106458 A1 Apr. 2, 2020

Related U.S. Application Data

(63) Continuation of application No. PCT/CN2017/087109, filed on Jun. 3, 2017.

(51) Int. Cl.
*H03M 13/00* (2006.01)
*H03M 13/11* (2006.01)

(52) U.S. Cl.
CPC ..... *H03M 13/1148* (2013.01); *H03M 13/616* (2013.01)

(58) Field of Classification Search
None
See application file for complete search history.

(56) References Cited

U.S. PATENT DOCUMENTS 7,630,456 B2 12/2009 Mogre et al.
8,392,789 B2 3/2013 Biscondi et al.
(Continued)

FOREIGN PATENT DOCUMENTS

CN 1805291 A 7/2006
CN 101005334 A 7/2007
(Continued)

OTHER PUBLICATIONS

ZTE et al., "Compact LDPC design for eMBB",3GPP TSG RAN WG1 AH NR Meeting R1-1701473,Spokane, USA Jan. 16-20, 2017,Total 19 Pages.
(Continued)

*Primary Examiner* — Mujtaba M Chaudry
(74) *Attorney, Agent, or Firm* — Womble Bond Dickinson (US) LLP

(57) ABSTRACT

This application discloses an information processing method and apparatus, a communications device, and a communications system. The method includes: encoding an input sequence by using a low density parity check LDPC matrix to obtain a bit sequence D, where a base matrix of the LDPC matrix is represented by a matrix of m rows and n columns, each column corresponds to a group of Z continuous bits in the bit sequence D, and both n and Z are integers greater than 0; and obtaining an output bit sequence based on a bit sequence V, where the bit sequence V is obtained by permuting groups of bits corresponding to at least two parity check columns in the bit sequence D.

22 Claims, 10 Drawing Sheets

(56) References Cited

U.S. PATENT DOCUMENTS

| | | | |
|---|---|---|---|
| 9,104,589 B1* | 8/2015 | Landon | H03M 13/1185 |
| 9,112,534 B2* | 8/2015 | Fonseka | H03M 13/2957 |
| 2004/0187129 A1 | 9/2004 | Richardson | |
| 2007/0043998 A1* | 2/2007 | Lakkis | H03M 13/116 |
| | | | 714/758 |
| 2008/0178065 A1 | 7/2008 | Khandekar et al. | |
| 2009/0083604 A1* | 3/2009 | Tong | H03M 13/1194 |
| | | | 714/752 |
| 2009/0249157 A1 | 10/2009 | Lee et al. | |
| 2011/0307755 A1 | 12/2011 | Livshitz et al. | |
| 2013/0317813 A1 | 11/2013 | Gao | |
| 2014/0153625 A1* | 6/2014 | Vojcic | H03M 13/1131 |
| | | | 375/224 |
| 2014/0223254 A1 | 8/2014 | Pisek | |
| 2015/0039963 A1* | 2/2015 | Fonseka | H03M 13/2918 |
| | | | 714/755 |
| 2016/0013809 A1* | 1/2016 | Myung | H03M 13/616 |
| | | | 714/776 |
| 2016/0352419 A1* | 12/2016 | Fonseka | H03M 13/2775 |

FOREIGN PATENT DOCUMENTS

| | | |
|---|---|---|
| CN | 101192833 A | 6/2008 |
| CN | 101217284 A | 7/2008 |
| CN | 101217337 A | 7/2008 |
| CN | 101399554 A | 4/2009 |
| CN | 101490963 A | 7/2009 |
| CN | 101515839 A | 8/2009 |
| CN | 101686061 A | 3/2010 |
| CN | 102868483 A | 1/2013 |
| CN | 103560993 A | 2/2014 |
| CN | 104579576 A | 4/2015 |
| EP | 3641172 A1 | 4/2020 |
| WO | 2015002507 A1 | 1/2015 |

OTHER PUBLICATIONS

IEEE Std 802.11ad-2012 Part 11: Wireless LAN Medium Access Control (MAC) and Physical Layer (PHY) Specifications,Amendment 3: Enhancements for Very High Throughput in the 60 GHz Band,IEEE Computer Society, dated Oct. 19, 2012,total 628 pages.
ZTE et al.,"Compact LDPC design for eMBB",3GPP TSG RAN WG1 AH NR Meeting,R1-1700247,Spokane, USA Jan. 16-20, 2017,Total 16 Pages.
R. G. Gallager; Low Density Parity Check Codes; IRE Transactions on Information Theory; Jan. 2016, 1962; pp. 21-28; total 8 pages.
Huawei et al: LDPC design for eMBB data, 3GPP Draft; R1-1704250, Apr. 2, 2017 (Apr. 2, 2017), XP051242402,total 6 pages.

* cited by examiner

CONT. FROM FIG. 9A

FIG. 9B

INFORMATION PROCESSING METHOD AND COMMUNICATIONS APPARATUS

CROSS-REFERENCE TO RELATED APPLICATIONS

This application is a continuation of International Application No. PCT/CN2017/087109, filed on Jun. 3, 2017, the disclosure of which is herein incorporated by reference in its entirety.

TECHNICAL FIELD

Embodiments of the present invention relate to the communications field, and in particular, to an information processing method and a communications apparatus.

BACKGROUND

A low density parity check (LDPC) code is a type of linear packet code having a sparse check matrix, and is featured by a flexible structure and low decoding complexity. Using a partially parallel iterative decoding algorithm, the low density parity check has a higher throughput rate than that of a conventional Turbo code. The LDPC code may be used as an error-correcting code for a communications system, to improve reliability and power utilization of channel transmission. The LDPC code may further be widely applied to space communications, optical fiber communication, a personal communications system, an ADSL, and a magnetic recording device, and the like. Currently, in the fifth-generation mobile communication, using the LDPC code as one of channel coding manners has been taken into consideration.

During actual use, an LDPC matrix with a special structured feature may be used. The LDPC matrix H with a special structural feature may be obtained by extending an LDPC base matrix with a quasi-cyclic structure.

Generally, a length of a bit sequence of to-be-encoded information ranges from dozens to hundreds bits, and the communications system also requires flexible code rates. When a code rate is relatively high, puncturing often needs to be performed on an encoded bit sequence, but the puncturing on the bit sequence may affect performance of the LDPC code.

SUMMARY

Embodiments of the present invention provide an information processing method, and a communications apparatus and system, to meet performance requirements of an LDPC code at a high code rate.

According to a first aspect, an information processing method is provided, and the method includes:

encoding an input sequence by using a low density parity check LDPC matrix to obtain a bit sequence D, where a base matrix of the LDPC matrix is represented by a matrix of m rows and n columns, each column corresponds to a group of Z continuous bits in the bit sequence D, and both n and Z are integers greater than 0; and obtaining an output bit sequence based on a bit sequence V, where the bit sequence V is obtained by permuting groups of bits corresponding to at least two parity check columns in the bit sequence D, the at least two parity check columns are at least two columns of a column (n−m) to a column (n−1) of the base matrix, a group j of Z continuous bits in the bit sequence V are a group P(j) of Z continuous bits in the bit sequence D, j is an integer, and $0 \leq j < n$.

According to a second aspect, an information processing method is provided, and the method includes:

obtaining a soft value sequence V' based on a signal encoded by using a low density parity check LDPC matrix; and decoding a soft value sequence D' by using the LDPC matrix, where a base matrix of the LDPC matrix is represented by a matrix of m rows and n columns, each column corresponds to a group of Z continuous soft channel bits in the soft value sequence D', and both n and Z are integers greater than 0;

a group j of Z continuous soft channel bits in the soft value sequence V are a group P(j) of Z continuous soft channel bits in the soft value sequence D', j is an integer, and $0 \leq j < n$; and the soft value sequence V is obtained by permuting groups of bits corresponding to at least two parity check columns in the soft value sequence D', and the at least two parity check columns are at least two columns of a column (n−m) to a column (n−1) of the base matrix.

In the first implementation of the first aspect or the second aspect, the at least two parity check columns may include a parity check column whose column weight is 2 and that is in a bidiagonal structure in a core matrix part.

In one embodiment, the at least two parity check columns may include a parity check column whose column weight is 2 and a parity check column whose column weight is greater than 2 and that are in a bidiagonal structure in a core matrix part.

For example, the at least two parity check columns are at least two columns in $\{P(a+i) | 0 \leq i < 6\}$ of the base matrix, where $\{P(a+i) | 0 \leq i < 6\} = \{22, 23, 24, 25, 26, 27\}$.

The bit sequence V is obtained by permuting at least two groups of Z continuous bits in $\{P(a+i) | 0 \leq i < 6\}$ in the bit sequence D, or the soft value sequence V' is obtained by permuting at least two groups of Z continuous bits in $\{P(a+i) | 0 \leq i < 6\}$ in the soft value sequence D'.

In one embodiment, $P(a+5)=26$, $P(a+4)=27$;

$P(a+5)=27, P(a+4)=26;$ $P(a+5)=25, P(a+4)=26;$ $P(a+5)=26, P(a+4)=25;$ $P(a+5)=25, P(a+4)=27;$ or $P(a+5)=27, P(a+4)=25.$

Based on the foregoing implementation, $a=20$ or $a=22$.

In one embodiment, $\{P(a+i) | 0 \leq i < 6\}$ includes any group of values in Table 1 to Table 6.

In one embodiment, the at least two parity check columns may further include a parity check column whose column weight is 2, a parity check column whose column weight is greater than 2, and a parity check column whose column weight is 1 and that are in the bidiagonal structure in the core matrix part.

For example, the at least two parity check columns are at least two columns in $\{P(a+i) | 0 \leq i < 6\}$ of the base matrix, where $\{P(a+i) | 0 \leq i < 6\} = \{22, 23, 24, 25, 26, 27\}$.

The bit sequence V is obtained by permuting at least two groups of Z continuous bits in $\{P(a+i) | 0 \leq i < 6\}$ in the bit sequence D, or the soft value sequence V' is obtained by permuting at least two groups of Z continuous bits in $\{P(a+i) | 0 \leq i < 6\}$ in the soft value sequence D'.

Based on the foregoing implementation, in one embodiment, when a=20, obtaining the output bit sequence by using the bit 0 of the bit sequence V as a starting position; or when a=20, obtaining the output bit sequence by using the bit 0 of the bit sequence V as a starting position, where the output bit sequence does not include the group 0 of bits and the group 1 of bits in the bit sequence D; or when a=22, obtaining the output bit sequence by using a bit (2*Z) of the bit sequence V as a starting position.

Based on the foregoing aspects, or any possible implementation of the foregoing aspects, in one embodiment, the base matrix of the LDPC matrix may be stored in a memory.

Based on the foregoing aspects, or any possible implementation of the foregoing aspects, in one embodiment, a base graph of the LDPC matrix is stored in the memory, and shift values of non-zero entries in the base matrix of the LDPC matrix may be stored in the memory.

According to a third aspect, a communications apparatus is provided, and the communications apparatus may include a corresponding module configured to execute any possible implementation of the first aspect in the foregoing method designs. The module may be software and/or hardware.

In one embodiment, the communications apparatus provided in the third aspect includes a coding unit and a processing unit. The coding unit is configured to encode an input sequence by using a low density parity check LDPC matrix to obtain a bit sequence D, and the processing unit obtains an output bit sequence based on a bit sequence V.

In one embodiment, the communications apparatus further includes a transceiver, and the transceiver is configured to send a signal corresponding to encoded information data.

According to a fourth aspect, a communications apparatus is provided, and the communications apparatus may include a corresponding module configured to execute any possible implementation of the second aspect in the foregoing method designs. The module may be software and/or hardware.

In one embodiment, the communications apparatus provided in the fourth aspect includes a decoding unit and a processing unit. The processing unit is configured to obtain a soft value sequence V based on a signal encoded by using a low density parity check LDPC matrix. The decoding unit decodes a soft value sequence D' by using the LDPC matrix.

The communications apparatus further includes a transceiver, and the transceiver is configured to receive a signal encoded based on LDPC scheme.

According to a fifth aspect, a communications apparatus is provided, and the communications apparatus includes one or more processors.

In one embodiment, the one or more processors can implement the function of the information processing method in the first aspect or the communications apparatus in the third aspect, and In one embodiment, in addition to implementing the function of the information processing method in the first aspect, the processor may further implement other functions.

In one embodiment, the one or more processors can implement the function of the information processing method in the second aspect, and in one embodiment, in addition to implementing the function of the information processing method in the second aspect, the processor may further implement other functions.

In one embodiment, the communications apparatus may further include a transceiver and an antenna.

In one embodiment, the communications apparatus may further include a device configured to generate a transmission block CRC, a device used for code block segmentation and CRC check, an interleaver used for interleaving, a modulator used for modulation, and the like.

In one embodiment, the communications apparatus may further include a demodulator used for a demodulation operation, a de-interleaver used for de-interleaving, a device used for rate de-matching, or the like. Functions of the devices may be implemented by using one or more processors.

In one embodiment, the one or more processors may be used to implement the functions of the devices.

According to a sixth aspect, an embodiment of the present invention provides a communications system, and the system includes the communications apparatus described in the third aspect and the communications apparatus described in the fourth aspect.

According to a seventh aspect, an embodiment of the present invention provides a communications system, and the communications system includes one or more communications apparatuses described in the fifth aspect.

In another aspect, an embodiment of the present invention provides a computer storage medium, where the computer storage medium stores a program, and when the program is run, a computer is enabled to perform the method according to the foregoing aspects.

Still another aspect of this application provides a computer program product including instructions, and when the instructions are run on a computer, the computer is enabled to perform the method according to the foregoing aspects.

According to the information processing method and apparatus, the communications device, and the communications system in the embodiments of the present invention, the performance requirements of the LDPC code at the high code rate can be met.

BRIEF DESCRIPTION OF DRAWINGS

FIG. 1 is a schematic diagram of a base graph, a base matrix, and circular permutation matrices of an LDPC code;

FIG. 3A and FIG. 3B are a schematic diagram of a base matrix of an LDPC code according to an embodiment of the present invention;

FIG. 9A and FIG. 9B are a schematic diagram of a matrix obtained after permutation according to another embodiment of the present invention.

DESCRIPTION OF EMBODIMENTS

Figure 2:
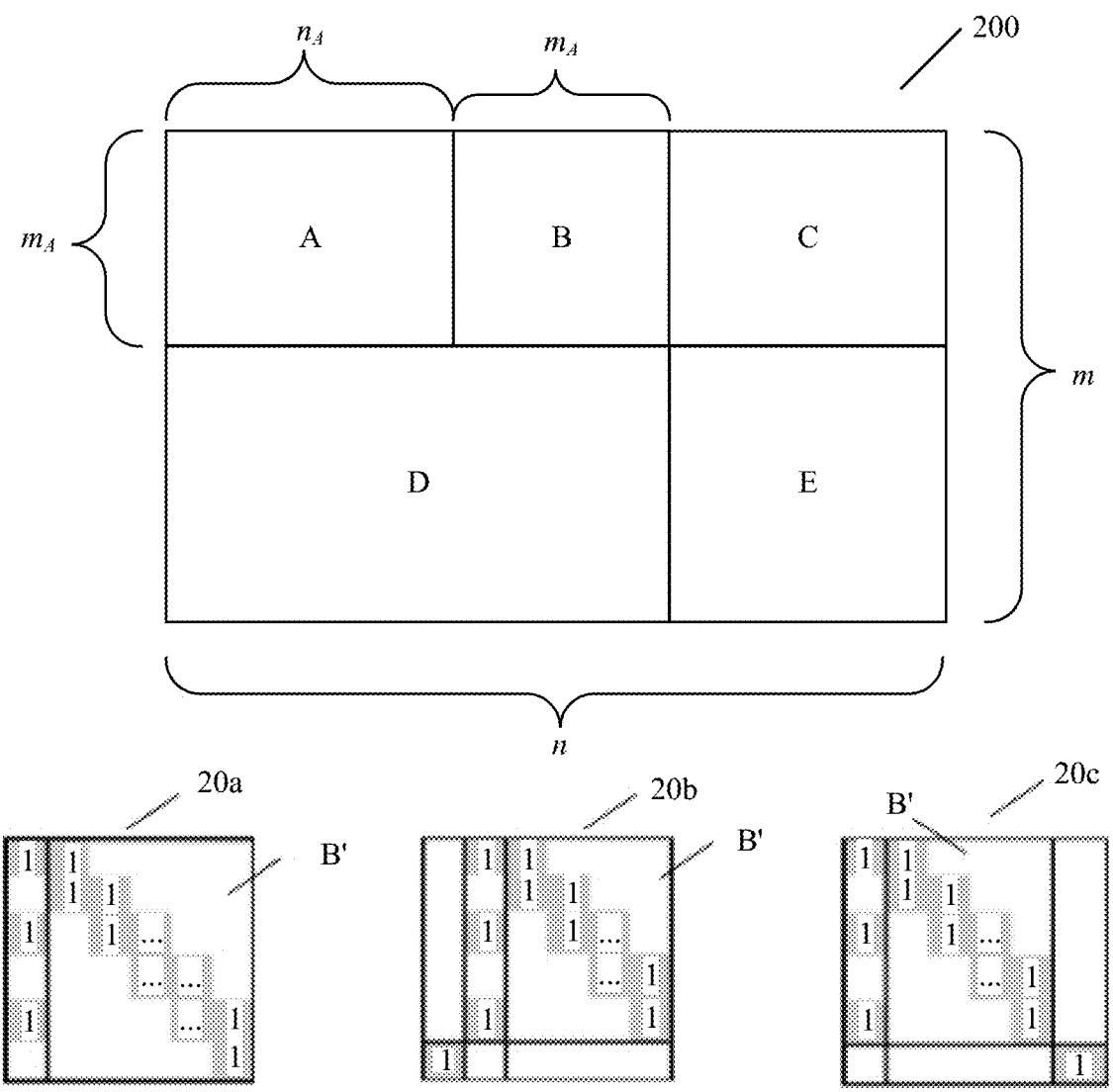
FIG. 2 is a schematic structural diagram of a base graph of an LDPC code.

For ease of understanding, nouns in this application are described below.

In this application, nouns "network" and "system" are usually alternately used and "apparatus" and "device" are also usually alternately used, and persons skilled in the art can understand meanings of the nouns. A "communications apparatus" may be a chip (such as a baseband chip, a digital signal processing chip, or a general processing chip), a terminal, a base station, or another network device. A terminal is a device having a communication function, and may include a handheld device, an in-vehicle device, a wearable device, a computing device, another processing device connected to a modem, or the like that has a wireless communication function. In different networks, the terminal may be referred to as different names, for example, user equipment, a mobile station, a subscriber unit, a station, a cellular phone, a personal digital assistant, a wireless modem, a wireless communications device, a handheld device, a laptop computer, a cordless phone, a wireless local loop board, and the like. For ease of description, the terminal device is referred to as a terminal for short in this application. The base station (BS) may also be referred to as a base station device, and is a device deployed in a radio access network and configured to provide a wireless communication function. In different radio access systems, the base station may have different names. For example, in a universal mobile telecommunications system (UMTS) network, the base station is referred to as a nodeB (NodeB); in an LTE network, the base station is referred to as an evolved nodeB (eNB or eNodeB); or in a new radio (NR) network, the base station is referred to as a transmission reception point (TRP) or a next-generation nodeB (gNB). Alternatively, in other various evolved networks, the base station may have other names. The present invention is not limited thereto.

The following describes the technical solutions in the embodiments of the present invention with reference to the accompanying drawings in the embodiments of the present invention.

Figure 1:
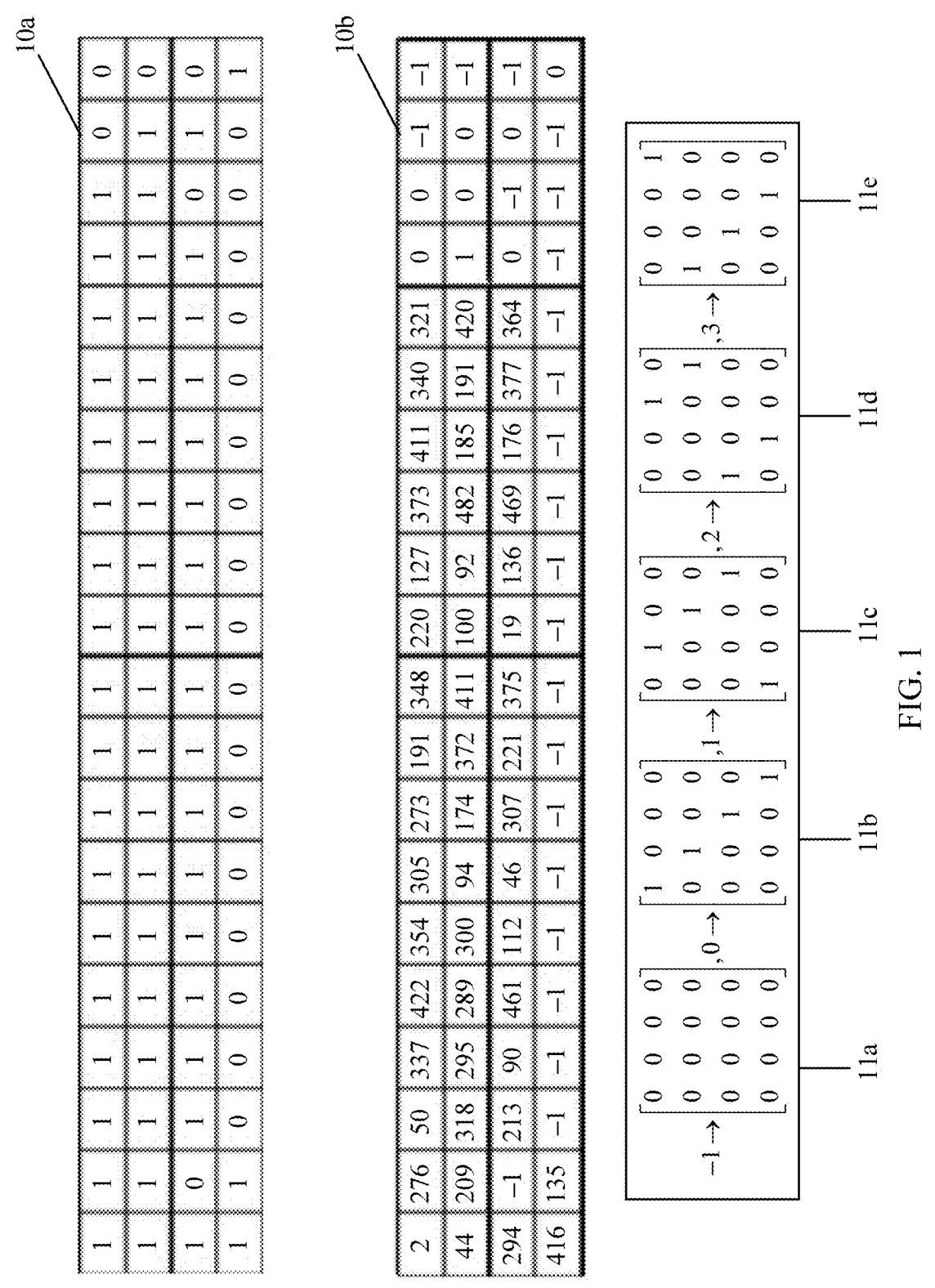

An LDPC code may usually be represented by using a parity check matrix H. The parity check matrix H of the LDPC code may be obtained by using a base graph and a shift value. The base graph may usually include m*n matrix entries (entry) that may be represented in a form of a matrix of m rows and n columns. A value of the matrix entry is 0 or 1. An entry whose value is 0 is sometimes referred to as a zero entry, indicating that the entry may be replaced with a Z*Z zero matrix; and an entry whose value is 1 is sometimes referred to as a non-zero entry, indicating that the entry may be replaced with a Z*Z circular permutation matrix. That is, each matrix entry represents a zero matrix or a circular permutation matrix. As shown in FIG. 1, 10a shows an example of entries in a base graph of an LDPC code that has a QC structure, where m=4, and n=20. It should be noted that in this specification, row numbers and column numbers of a base graph and a base matrix all start from 0 merely for ease of understanding. It may be understood that the row number and the column number may alternatively start from 1, and in this case, a corresponding row number and column number are increased by 1 based on the row number and the column number in this specification.

If an entry at a row i and column j in a base graph has a value of 1 and a shift value of $P_{i,j}$, where $P_{i,j}$ is an integer greater than or equal to 0, it indicates that the entry at the row i and column j whose value is 1 may be replaced with a Z*Z circular permutation matrix corresponding to $P_{i,j}$, and the circular permutation matrix may be obtained by circularly shifting an identity matrix of size Z*Z for $P_{i,j}$ times on. It can be learned that if each entry whose value is 0 in the base graph is replaced with an all-zero matrix of size Z*Z, and each entry whose value is 1 is replaced with a circular permutation matrix of size Z*Z corresponding to a shift value of the entry, a parity check matrix of the LDPC code can be obtained. Z is a positive integer, and may be referred to as a lifting factor and determined based on a code block size and an information data size supported by a system. It can be learned that a size of the parity check matrix H is (m*Z)*(n*Z). For example, if the lifting factor is Z=4, each zero entry is replaced with a 4*4 zero matrix 11a. If $P_{2,3}=2$, a non-zero entry at the row 2 and the column 3 is replaced with a 4*4 circular permutation matrix 11d, and the matrix is obtained by performing rightward circulant shift twice on a 4*4 identity matrix 11b. If $P_{2,4}=0$, a non-zero entry at row 2 and column 4 is replaced with an identity matrix 11b. It should be noted that only an example is provided herein for description, and the present invention is not limited thereto.

$P_{i,j}$ may be obtained based on the lifting factor Z, so that for entries whose values are 1 at a same position, there may be different $P_{i,j}$ if different lifting factors Z are used. To simplify implementation, usually, the system also defines a base matrix of m rows and n columns, and in the base matrix, entries have a one-to-one correspondence with positions of the entries in the base graph. Zero entries in the base graph have fixed positions in the base matrix and are represented by −1, and non-zero entries whose values are 1 at the row i and the column j in the base graph have fixed positions in the base matrix and may be represented by $P_{i,j}$, where $P_{i,j}$ is a positive integer greater than or equal to 0. In this embodiment of this application, sometimes the base matrix is also referred to as a shift matrix of a base graph matrix. If an input sequence is encoded based on the base matrix of m rows and n columns, each column in the base matrix corresponds to Z continuous bits in an encoded bit sequence.

10b in FIG. 1 shows a base matrix corresponding to the base graph 10a.

Usually, the base graph or the base matrix of the LDPC code may further include p built-in puncture bit columns, where p may be an integer ranging from 0 to 2. These columns participate in encoding, but however, system bits corresponding to these columns used in encoding are not sent, so that a code rate of the base matrix of the LDPC code meets R=(n−m)/(n−p). For a base matrix of 4 rows and 20 columns (4*20), if there are two built-in puncture bit columns, the code rate is (20−4)/(20−2)=8/9.

A wireless communications system uses an LDPC code, and a matrix of a base graph of the LDPC code has a size of m rows and n columns and may include five submatrices A, B, C, D, and E. A weight of the matrix depends on a quantity of non-zero entries, a weight of a row (a row weight) is a quantity of non-zero entries included in a row, and a weight of a column (a column weight) is a quantity of non-zero entries included in a column. As shown in 200 in FIG. 2:

The submatrix A is a matrix of $m_A$ rows and $n_A$ columns, and may have a size of $m_A*n_A$. Each column corresponds to Z system bits in the LDPC code, and the system bit is sometimes referred to as an information bit.

The submatrix B is matrix of $m_A$ rows and $m_A$ columns, and may have a size of $m_A*m_A$. Each column corresponds to Z check bits in the LDPC code. The submatrix B includes a submatrix B' having a bidiagonal structure and a matrix column whose weight is 3 (briefly referred to as 3-column-weight column). The matrix column whose column weight is 3 is located before the submatrix B', as shown in 20a in FIG. 2. The submatrix B may further include a matrix column whose column weight is 1 (briefly referred to as a one-column-weight column). The one-column-weight column may be located in the first column or the last column of the submatrix B, and non-zero entries in the one-column-weight column are located in the last row of the submatrix B, so that the last row of the submatrix B has a row weight of 1, as shown in 20b or 20c in FIG. 2.

Usually, a matrix generated based on the submatrices A and B are core matrices, and can be used to support high-bit-rate encoding.

The submatrix C is a zero matrix, and has a size of $m_A \times (n-(m_A+n_A))$.

The submatrix E is an identity matrix, and has a size of $(m-m_A) \times (m-m_A)$.

The submatrix D has a size of $(m-m_A) \times (n_A+m_A)$, and usually can be used to generate a low-bit-rate parity bit.

Figure 3A:
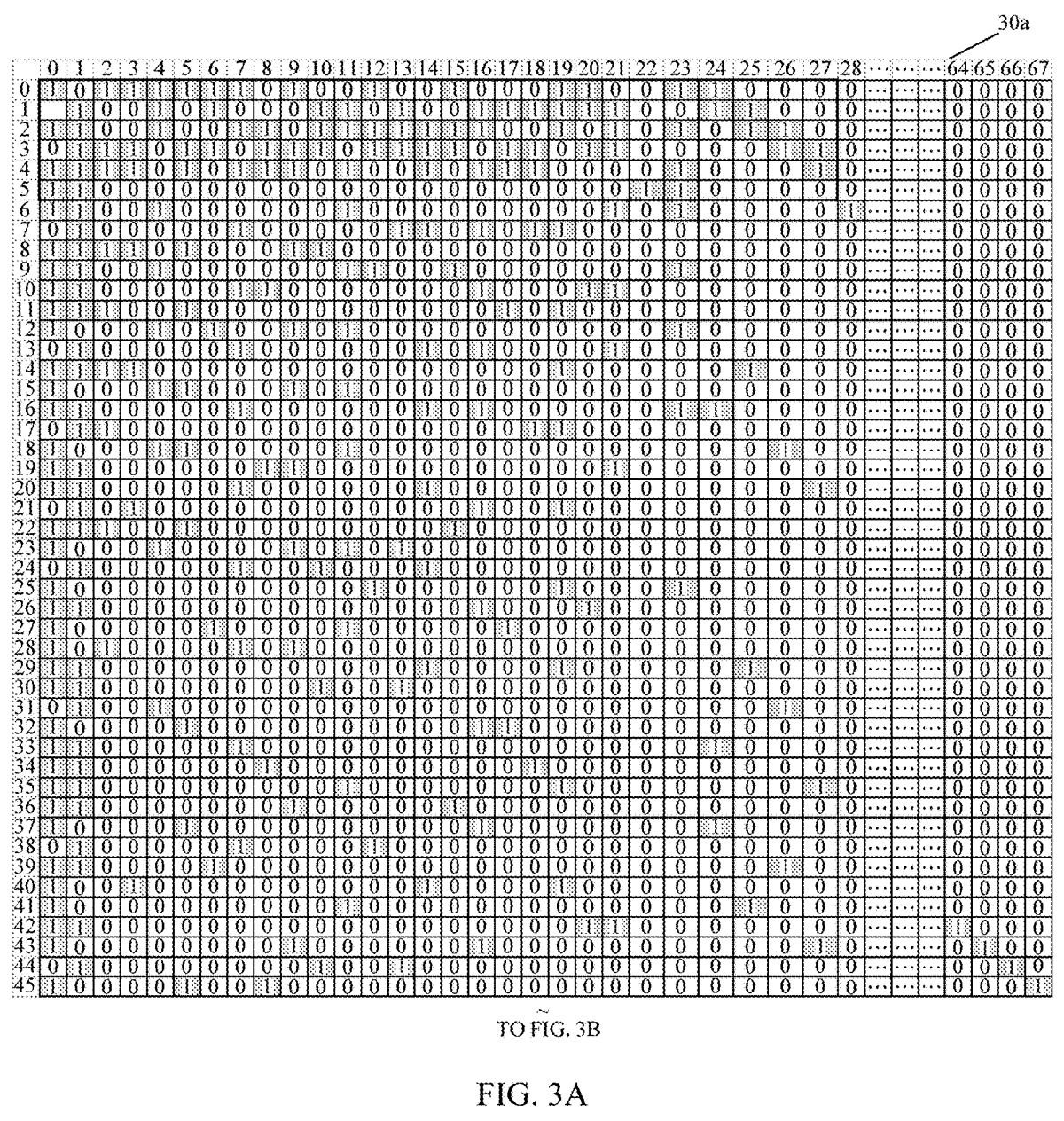
Figure 3B:
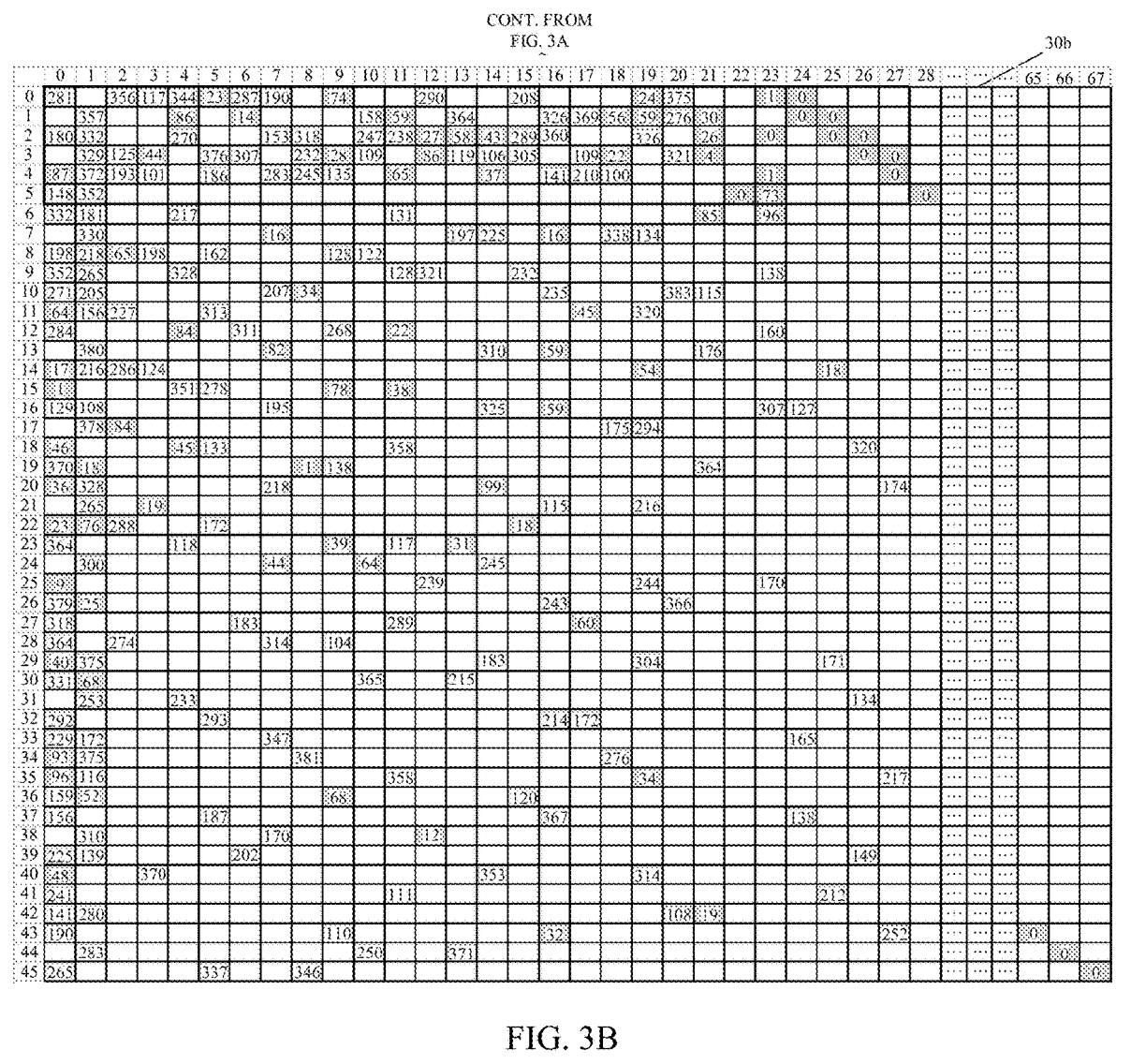

FIG. 3A and FIG. 3B show an example of a base graph 30a and a corresponding base matrix 30b of an LDPC code, and the matrix has 46 rows and 68 columns. In one embodiment, the submatrix A is a matrix part including the row 0 to the row 4 and the column 0 to the column 21, and the submatrix B is a matrix part including the row 0 to the row 4 and the column 22 to the column 26. In one embodiment, the submatrix A is a matrix part including the row 0 to the row 5 and the column 0 to the column 21, and the submatrix B is a matrix part including the row 0 to the row 5 and the column 22 to the column 27.

The submatrix A and the submatrix B form a core matrix part of the base matrix.

To obtain flexible code rates, the submatrix C, the submatrix D, and the submatrix E of corresponding sizes may be added based on a core matrix, to obtain different code rates. The submatrix C is a zero matrix, and the submatrix is an identity matrix whose size mainly depends on a code rate, and whose structure is relatively fixed. The core matrix and the submatrix D part mainly affect encoding and decoding performance. Rows and columns are added based on the core matrix, to form corresponding C, D, and E parts, so that different code rates can be obtained.

A quantity of columns of the submatrix D is a sum of quantities of columns of the submatrices A and B, and a quantity of rows of the submatrix D is mainly related to a code rate. Using the base graph 30a as an example, if the submatrix A has 5 rows and 22 columns, a corresponding quantity $m_D$ of columns of the submatrix D is $(n_A+m_A)=27$, and if a code rate supported by an LDPC code is $R_m$, a size of a base graph or a base matrix of the LDPC code is m*n, where $n=n_A/R_m+p$, and $m=n-n_A=n_A/R_m+p-n_A$. If a lowest code rate $R_m=\frac{1}{3}$, and a quantity of built-in puncture columns p=2, and the base graph 30a is used as an example, n=68, m=46, and a quantity $m_D$ of rows of the submatrix D may be $m-m_A=46-5=41$ at maximum, that is, $0 \leq m_D \leq 41$.

If the base matrix may include two built-in puncture bit columns, and after puncturing is performed, the core matrix may support a code rate of 22/(27-2)=0.88. If a higher code rate needs to be obtained, parity bits further needs to be punctured. For example, a matrix including the row 0 to the row 5 and the column 0 to the column 27 of the base graph 30a is used as an example. After an input sequence is encoded based on an LDPC matrix that is obtained based on the matrix, a bit sequence D is obtained, and if bits corresponding to the built-in puncture columns are punctured, and bits corresponding to any two of the column 22 to the column 27 are punctured, a code rate obtained after the bit sequence D is punctured is 22/24=0.916. It should be noted that, only an example is provided herein, and more parity check columns may be punctured to obtain a higher code rate. Details are not described herein again.

Figure 4:
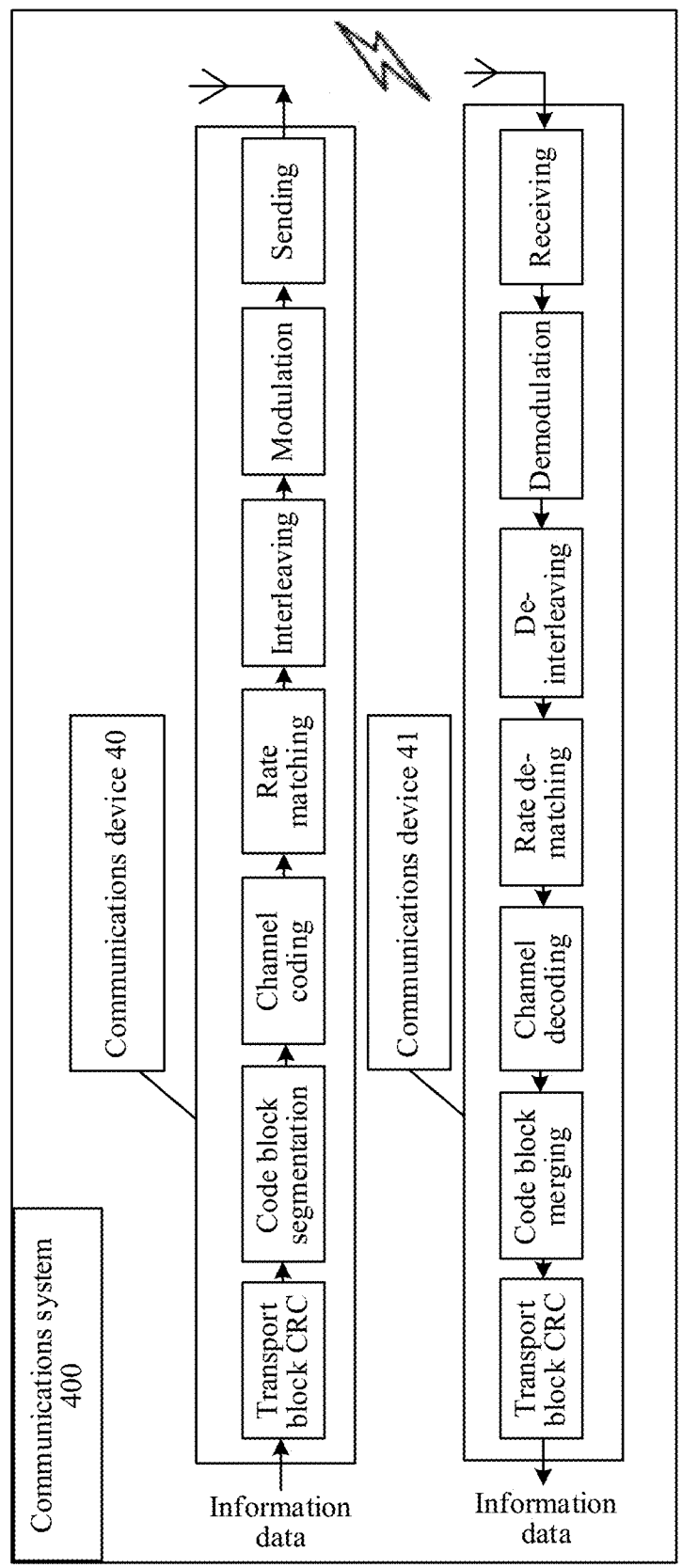
FIG. 4 is a schematic diagram of a communications system according to another embodiment of the present invention.

As shown in FIG. 4, a communications system 400 includes a communications device 40 and a communications device 41, and control information or data information is used as an information sequence and received and sent between the communications device 40 and the communications device 41. For example, the communications device 40 sends an information sequence. After transport block CRC and code block segmentation are performed on the information sequence, an input sequence C for channel coding is obtained, a bit sequence D is obtained after the channel coding is performed on the input sequence C, and an output bit sequence E is obtained after rate matching is performed on the bit sequence D, and then the output bit sequence E is sent after further processing such as interleaving and modulation. That the communications device 41 receives an information sequence is an inverse process of the sending process. In a rate matching process, puncturing on and selection of the bit sequence D are determined based on a code rate, thereby obtaining an output bit sequence. To ensure puncturing performance at a high code rate, a bit sequence corresponding to a column in which parity bits in the bit sequence D is located needs to be adjusted and permuted. In an example, the communications device 40 may be a terminal, and the corresponding communications device 41 may be a base station. In another example, the communications device 40 is a base station, and the corresponding communications device 41 may be a terminal.

Figure 5:
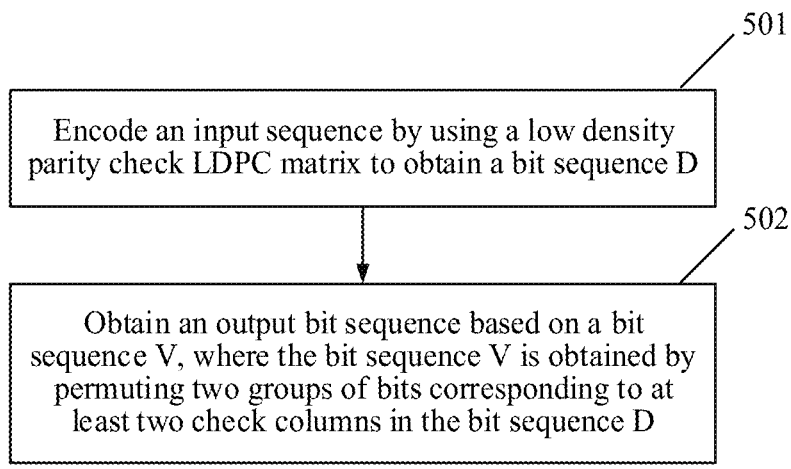
FIG. 5 is a flowchart of an information processing method according to another embodiment of the present invention.

FIG. 5 is a flowchart of an information processing method according to an embodiment of the present invention. This method includes the following steps.

501: Encode an input sequence by using an LDPC matrix to obtain a bit sequence D.

A base graph of the LDPC matrix may be the matrix of m rows and n columns in the foregoing example, such as the base graph 30a. Each column corresponds to a group of Z continuous bits in the bit sequence D, and both n and Z are integers greater than 0. It should be noted that, the base graph 30a and the base matrix 30b herein and in the following steps are only used as an example, this embodiment of the present invention is not limited thereto, and other base graphs and basis matrices may be applicable.

502: Obtain an output bit sequence based on a bit sequence V.

The bit sequence V is obtained by permuting groups of bits corresponding to at least two parity check columns in the bit sequence D.

It can be learned according to the foregoing examples that, a parity check column may be a column (n−m) to a column (n−1) of the base matrix, and for example, for the base graph 30a, the parity check column may be the column 22 to the column 67.

After puncturing based on built-in puncture columns, to further obtain a higher code rate, parity bits may further be punctured, and bits corresponding to a column that needs to be punctured may be permutated for puncturing.

In one embodiment, two columns of parity bits are punctured. If a quantity of punctured non-zero entries in each row is greater than or equal to 2, an obtained sequence cannot be recovered during decoding.

At least two groups of bits in the bit sequence D corresponding to at least two columns of the column (n−m) to the column (n−1) of the base matrix may be permutated, and each group of bits include Z continuous bits. Column numbers of the base matrix start from 0. In this case, after the permutation, a quantity of punctured non-zero entries in at least one row of a core matrix part is less than 2, so that performance at a high code rate can be ensured.

The at least two parity check columns are at least two columns of the column (n−m) to the column (n−1) of the base matrix, and column numbers of the base matrix start from 0. It may be understood that, if the column numbers of the base matrix start from 1, correspondingly, the at least two parity check columns are at least two columns of a column (n−m+1) to a column n of the base matrix. In this specification, unless particularly stated, row numbers and column numbers of a matrix all start from 0, and if row numbers and column numbers of a matrix start from 1, the row numbers and the column numbers are increased by 1 correspondingly.

For the base graph 30a, two columns in six parity check columns from the column 22 to the column 27 may be punctured.

After the permutation, a group j of Z continuous bits in the bit sequence V are a group P(j) of Z continuous bits in the bit sequence D, j is an integer, and 0≤j<n.

In one embodiment, if a starting group number of Z continuous bits corresponding to the six columns in the bit sequence V is a, {P(a+i)|0≤i<6}={22, 23, 24, 25, 26, 27}.

The permuting at least two groups of bits corresponding to at least two parity check columns in the bit sequence D to obtain the bit sequence V may be permuting at least two groups of Z continuous bits in {P(a+i)|0≤i<6} in the bit sequence D to obtain the bit sequence V.

According to the foregoing description as an example, the submatrix B usually has a bidiagonal structure, that is, these parity check columns have a bidiagonal structure. Puncturing is usually performed from back to front, and therefore, s columns that need to be punctured may be permutated to last s columns in the six columns, where s is an integer greater than 0, and for example, s=2, and a sequence of other columns may be adjusted as required.

Figure 9A:
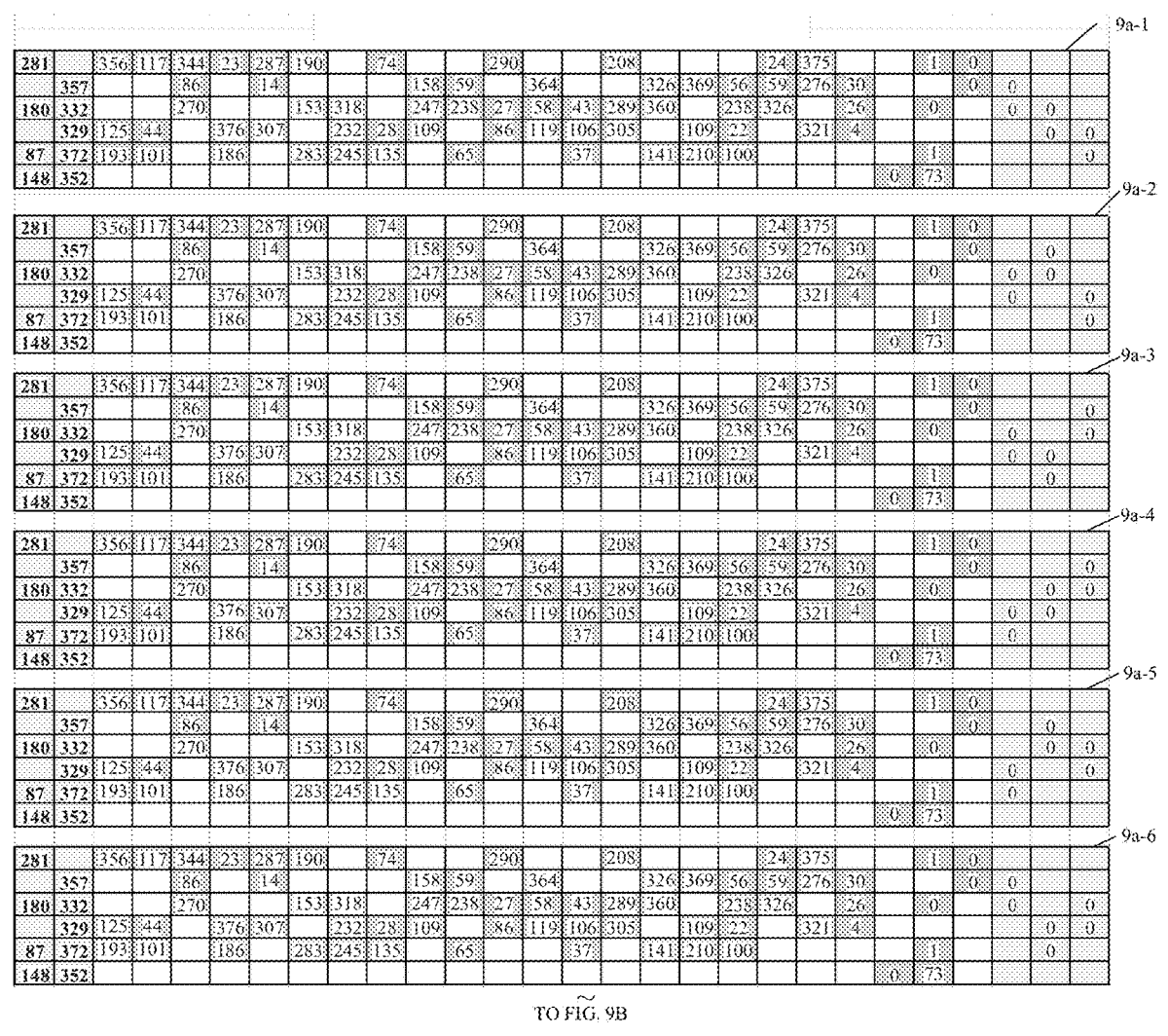
Figure 9B:
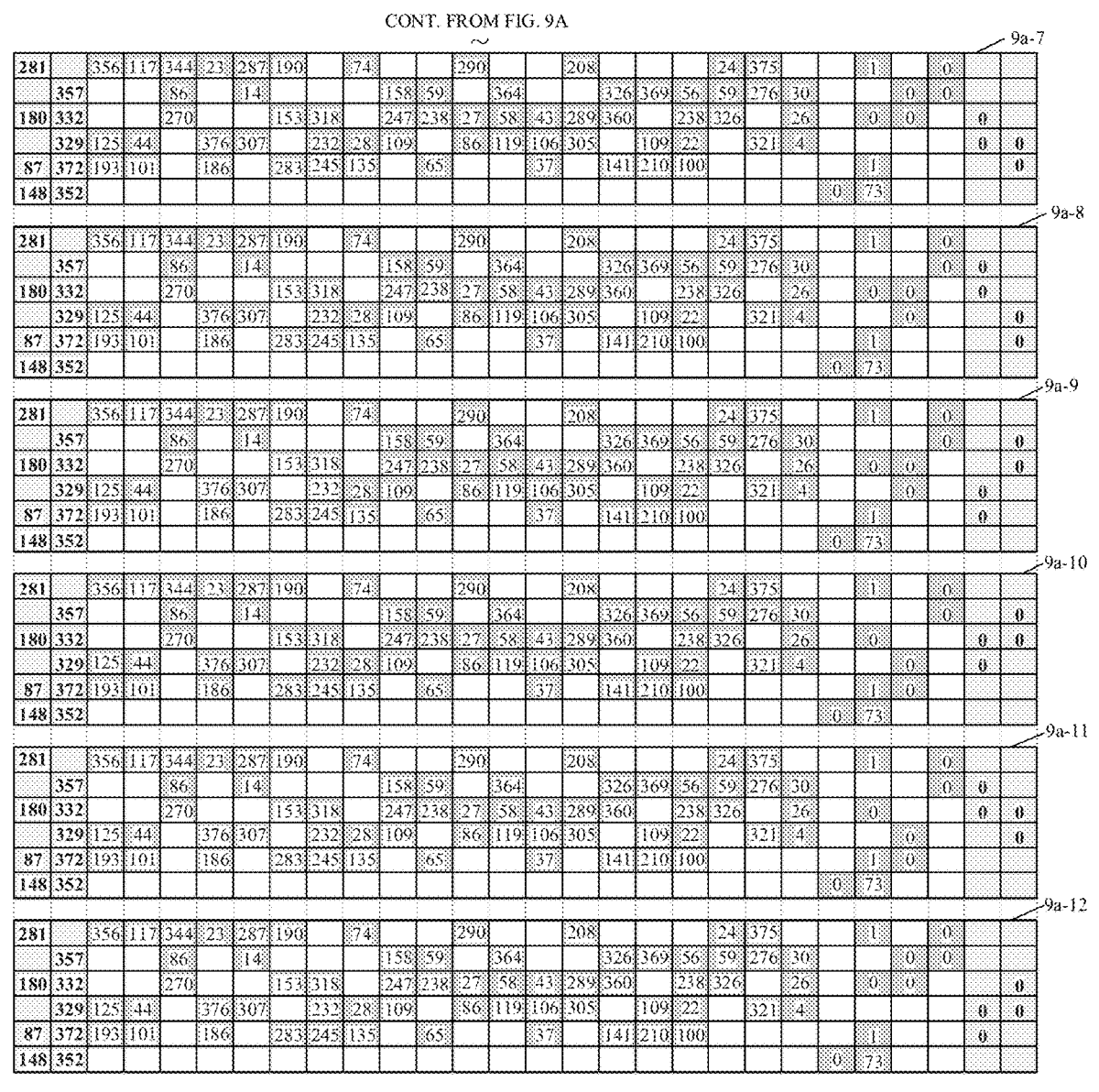

In a possible implementation, two of three columns: the column 25, the column 26, and the column 27 in the bit sequence D whose column weights are 2 are permutated to the last two columns of the six columns in the bit sequence V, as shown in 9a-1 to 9a-12 in FIG. 9A and FIG. 9B.

For example, the column 26 and the column 27 in the bit sequence D may be permutated to the last two columns of the six columns in the bit sequence V, that is, P(a+5)=26 and P(a+4)=27. Table 1 shows all groups of possible values of {P(a+i)|0≤i<6}. Alternatively, P(a+5)=27 and P(a+4)=26, and Table 2 shows all groups of possible values of {P(a+i)|0≤i<6}. In the table, each column represents values corresponding to entries in {P(a+i)|0≤i<6}, and each row is a group of possible value combinations.

TABLE 1

| P(a) | P(a + 1) | P(a + 2) | P(a + 3) | P(a + 4) | P(a + 5) |
|------|----------|----------|----------|----------|----------|
| 22 | 23 | 24 | 25 | 26 | 27 |
| 22 | 23 | 25 | 24 | 26 | 27 |
| 22 | 24 | 23 | 25 | 26 | 27 |
| 22 | 24 | 25 | 23 | 26 | 27 |
| 22 | 25 | 23 | 24 | 26 | 27 |
| 22 | 25 | 24 | 23 | 26 | 27 |
| 23 | 22 | 24 | 25 | 26 | 27 |
| 23 | 22 | 25 | 24 | 26 | 27 |
| 23 | 24 | 22 | 25 | 26 | 27 |
| 23 | 24 | 25 | 22 | 26 | 27 |
| 23 | 25 | 22 | 24 | 26 | 27 |
| 23 | 25 | 24 | 22 | 26 | 27 |
| 24 | 22 | 23 | 25 | 26 | 27 |
| 24 | 22 | 25 | 23 | 26 | 27 |
| 24 | 23 | 22 | 25 | 26 | 27 |
| 24 | 23 | 25 | 22 | 26 | 27 |
| 24 | 25 | 22 | 23 | 26 | 27 |
| 24 | 25 | 23 | 22 | 26 | 27 |
| 25 | 22 | 23 | 24 | 26 | 27 |
| 25 | 22 | 24 | 23 | 26 | 27 |
| 25 | 23 | 22 | 24 | 26 | 27 |
| 25 | 23 | 24 | 22 | 26 | 27 |
| 25 | 24 | 22 | 23 | 26 | 27 |
| 25 | 24 | 23 | 22 | 26 | 27 |

TABLE 2

| P(a) | P(a + 1) | P(a + 2) | P(a + 3) | P(a + 4) | P(a + 5) |
|------|----------|----------|----------|----------|----------|
| 22 | 23 | 24 | 25 | 27 | 26 |
| 22 | 23 | 25 | 24 | 27 | 26 |
| 22 | 24 | 23 | 25 | 27 | 26 |
| 22 | 24 | 25 | 23 | 27 | 26 |
| 22 | 25 | 23 | 24 | 27 | 26 |
| 22 | 25 | 24 | 23 | 27 | 26 |
| 23 | 22 | 24 | 25 | 27 | 26 |
| 23 | 22 | 25 | 24 | 27 | 26 |
| 23 | 24 | 22 | 25 | 27 | 26 |
| 23 | 24 | 25 | 22 | 27 | 26 |
| 23 | 25 | 22 | 24 | 27 | 26 |
| 23 | 25 | 24 | 22 | 27 | 26 |
| 24 | 22 | 23 | 25 | 27 | 26 |
| 24 | 22 | 25 | 23 | 27 | 26 |
| 24 | 23 | 22 | 25 | 27 | 26 |
| 24 | 23 | 25 | 22 | 27 | 26 |
| 24 | 25 | 22 | 23 | 27 | 26 |
| 24 | 25 | 23 | 22 | 27 | 26 |
| 25 | 22 | 23 | 24 | 27 | 26 |
| 25 | 22 | 24 | 23 | 27 | 26 |
| 25 | 23 | 22 | 24 | 27 | 26 |
| 25 | 23 | 24 | 22 | 27 | 26 |
| 25 | 24 | 22 | 23 | 27 | 26 |
| 25 | 24 | 23 | 22 | 27 | 26 |

For another example, the column 25 and the column 26 in the bit sequence D may be permutated to the last two columns of the six columns in the bit sequence V, that is, P(a+5)=25 and P(a+4)=26. Table 3 shows all groups of possible values of {P(a+i)|0≤i<6}. Alternatively, P(a+5)=26 and P(a+4)=25, and Table 4 shows all groups of possible values of {P(a+i)|0≤i<6}. In the table, each column represents values corresponding to entries in {P(a+i)|0≤i<6}, and each row is a group of possible value combinations.

TABLE 3

| P(a) | P(a + 1) | P(a + 2) | P(a + 3) | P(a + 4) | P(a + 5) |
|------|----------|----------|----------|----------|----------|
| 22 | 23 | 24 | 27 | 25 | 26 |
| 22 | 23 | 27 | 24 | 25 | 26 |
| 22 | 24 | 23 | 27 | 25 | 26 |
| 22 | 24 | 27 | 23 | 25 | 26 |
| 22 | 27 | 23 | 24 | 25 | 26 |
| 22 | 27 | 24 | 23 | 25 | 26 |
| 23 | 22 | 24 | 27 | 25 | 26 |
| 23 | 22 | 27 | 24 | 25 | 26 |
| 23 | 24 | 22 | 27 | 25 | 26 |
| 23 | 24 | 27 | 22 | 25 | 26 |
| 23 | 27 | 22 | 24 | 25 | 26 |
| 23 | 27 | 24 | 22 | 25 | 26 |
| 24 | 22 | 23 | 27 | 25 | 26 |
| 24 | 22 | 27 | 23 | 25 | 26 |
| 24 | 23 | 22 | 27 | 25 | 26 |
| 24 | 23 | 27 | 22 | 25 | 26 |
| 24 | 27 | 22 | 23 | 25 | 26 |
| 24 | 27 | 23 | 22 | 25 | 26 |
| 27 | 22 | 23 | 24 | 25 | 26 |
| 27 | 22 | 24 | 23 | 25 | 26 |
| 27 | 23 | 22 | 24 | 25 | 26 |
| 27 | 23 | 24 | 22 | 25 | 26 |
| 27 | 24 | 22 | 23 | 25 | 26 |
| 27 | 24 | 23 | 22 | 25 | 26 |

TABLE 4

| P(a) | P(a + 1) | P(a + 2) | P(a + 3) | P(a + 4) | P(a + 5) |
|------|----------|----------|----------|----------|----------|
| 22 | 23 | 24 | 27 | 26 | 25 |
| 22 | 23 | 27 | 24 | 26 | 25 |
| 22 | 24 | 23 | 27 | 26 | 25 |
| 22 | 24 | 27 | 23 | 26 | 25 |

TABLE 4-continued

| P(a) | P(a + 1) | P(a + 2) | P(a + 3) | P(a + 4) | P(a + 5) |
|---|---|---|---|---|---|
| 22 | 27 | 23 | 24 | 26 | 25 |
| 22 | 27 | 24 | 23 | 26 | 25 |
| 23 | 22 | 24 | 27 | 26 | 25 |
| 23 | 22 | 27 | 24 | 26 | 25 |
| 23 | 24 | 22 | 27 | 26 | 25 |
| 23 | 24 | 27 | 22 | 26 | 25 |
| 23 | 27 | 22 | 24 | 26 | 25 |
| 23 | 27 | 24 | 22 | 26 | 25 |
| 24 | 22 | 23 | 27 | 26 | 25 |
| 24 | 22 | 27 | 23 | 26 | 25 |
| 24 | 23 | 22 | 27 | 26 | 25 |
| 24 | 23 | 27 | 22 | 26 | 25 |
| 24 | 27 | 22 | 23 | 26 | 25 |
| 24 | 27 | 23 | 22 | 26 | 25 |
| 27 | 22 | 23 | 24 | 26 | 25 |
| 27 | 22 | 24 | 23 | 26 | 25 |
| 27 | 23 | 22 | 24 | 26 | 25 |
| 27 | 23 | 24 | 22 | 26 | 25 |
| 27 | 24 | 22 | 23 | 26 | 25 |
| 27 | 24 | 23 | 22 | 26 | 25 |

For another example, the column 25 and the column 27 in the bit sequence D may alternatively be permutated to the last two columns of the six columns in the bit sequence V, that is, P(a+5)=25 and P(a+4)=27. Table 5 shows all groups of possible values of {P(a+i)|0≤i<6}. Alternatively, P(a+5)=27 and P(a+4)=25, and Table 6 shows all groups of possible values of {P(a+i)|0≤i<6}. In the table, each column represents values corresponding to entries in {P(a+i)|0≤i<6}, and each row is a combination of a group of possible value combinations.

TABLE 5

| P(a) | P(a + 1) | P(a + 2) | P(a + 3) | P(a + 4) | P(a + 5) |
|---|---|---|---|---|---|
| 22 | 23 | 24 | 26 | 25 | 27 |
| 22 | 23 | 26 | 24 | 25 | 27 |
| 22 | 24 | 23 | 26 | 25 | 27 |
| 22 | 24 | 26 | 23 | 25 | 27 |
| 22 | 26 | 23 | 24 | 25 | 27 |
| 22 | 26 | 24 | 23 | 25 | 27 |
| 23 | 22 | 24 | 26 | 25 | 27 |
| 23 | 22 | 26 | 24 | 25 | 27 |
| 23 | 24 | 22 | 26 | 25 | 27 |
| 23 | 24 | 26 | 22 | 25 | 27 |
| 23 | 26 | 22 | 24 | 25 | 27 |
| 23 | 26 | 24 | 22 | 25 | 27 |
| 24 | 22 | 23 | 26 | 25 | 27 |
| 24 | 22 | 26 | 23 | 25 | 27 |
| 24 | 23 | 22 | 26 | 25 | 27 |
| 24 | 23 | 26 | 22 | 25 | 27 |
| 24 | 26 | 22 | 23 | 25 | 27 |
| 24 | 26 | 23 | 22 | 25 | 27 |
| 26 | 22 | 23 | 24 | 25 | 27 |
| 26 | 22 | 24 | 23 | 25 | 27 |

TABLE 5-continued

| P(a) | P(a + 1) | P(a + 2) | P(a + 3) | P(a + 4) | P(a + 5) |
|---|---|---|---|---|---|
| 26 | 23 | 22 | 24 | 25 | 27 |
| 26 | 23 | 24 | 22 | 25 | 27 |
| 26 | 24 | 22 | 23 | 25 | 27 |
| 26 | 24 | 23 | 22 | 25 | 27 |

TABLE 6

| P(a) | P(a + 1) | P(a + 2) | P(a + 3) | P(a + 4) | P(a + 5) |
|---|---|---|---|---|---|
| 22 | 23 | 24 | 26 | 27 | 25 |
| 22 | 23 | 26 | 24 | 27 | 25 |
| 22 | 24 | 23 | 26 | 27 | 25 |
| 22 | 24 | 26 | 23 | 27 | 25 |
| 22 | 26 | 23 | 24 | 27 | 25 |
| 22 | 26 | 24 | 23 | 27 | 25 |
| 23 | 22 | 24 | 26 | 27 | 25 |
| 23 | 22 | 26 | 24 | 27 | 25 |
| 23 | 24 | 22 | 26 | 27 | 25 |
| 23 | 24 | 26 | 22 | 27 | 25 |
| 23 | 26 | 22 | 24 | 27 | 25 |
| 23 | 26 | 24 | 22 | 27 | 25 |
| 24 | 22 | 23 | 26 | 27 | 25 |
| 24 | 22 | 26 | 23 | 27 | 25 |
| 24 | 23 | 22 | 26 | 27 | 25 |
| 24 | 23 | 26 | 22 | 27 | 25 |
| 24 | 26 | 22 | 23 | 27 | 25 |
| 24 | 26 | 23 | 22 | 27 | 25 |
| 26 | 22 | 23 | 24 | 27 | 25 |
| 26 | 22 | 24 | 23 | 27 | 25 |
| 26 | 23 | 22 | 24 | 27 | 25 |
| 26 | 23 | 24 | 22 | 27 | 25 |
| 26 | 24 | 22 | 23 | 27 | 25 |
| 26 | 24 | 23 | 22 | 27 | 25 |

A quantity of built-in puncture column usually is two, for example, the column 0 and the column 1. In a possible implementation, two groups of bits corresponding to a built-in puncture column in the bit sequence D may be permutated to the last two groups in the bit sequence V. Therefore, a possible permutation sequence is shown in Table 7, and in a sequence of from left to right and from up to down, Table 7 shows an example in which each group of bits in the bit sequence V correspond to a group P(j) of bits in the bit sequence D, for example, the group 0 of bits in the bit sequence V are the group 2 of bits in the bit sequence D, the group 1 of bits in the bit sequence V are the group 3 of bits in the bit sequence D, and by analogy, details are not described again. The group 20 of bits are P(a) in the bit sequence, that is, a=20. The group 65 of bits are the group 67 of bits in the bit sequence D, and the group 0 of bits and the group 1 of bits in the bit sequence D are placed at the group 66 of bits and the group 67 of bits in the bit sequence V. {P(a+i)|0≤i<6} may be any group of possible value combinations in Table 1 to Table 6.

TABLE 7

| Permutation sequence P(j), 0 ≤ j < n | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|
| | 19 | 20 | 21 | P(a) | P(a + 1) | P(a + 2) | P(a + 3) | P(a + 4) | P(a + 5) | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 |
| | 53 | 54 | 55 | 56 | 57 | 58 | 59 | 60 | 61 | 62 | 63 | 64 | 65 | 66 | 67 | 0 | 1 |

In the foregoing implementation, if the permutation sequence in Table 7 is used, the bit 0 in the bit sequence V may be used as a starting position during initial transmission to obtain an output bit sequence E, and in this case, the two groups of bits corresponding to the built-in puncture column may still be obtained during retransmission.

In one embodiment, the two groups of bits corresponding to the built-in puncture column in the bit sequence D are not permutated. A possible permutation sequence is shown in Table 8, and in a sequence of from left to right and from up to down, Table 8 shows an example in which each group of bits in the bit sequence V correspond to a group P(j) of bits in the bit sequence D. For example, the group 0 of bits in the bit sequence V are the group 0 of bits in the bit sequence D, and the group 1 of bits are the group 1 of bits in the bit sequence D, and by analogy, details are not described again. The group 22 of bits are P(a) in the bit sequence, that is, a=22, and the group 67 of bits are the group 67 of bits in the bit sequence D. $\{P(a+i)|0\leq i<6\}$ may be any group of possible value combinations in Table 1 to Table 6.

built-in puncture column, that is, the group 0 of bits and the group 1 of bits in the bit sequence D.

Figure 8:
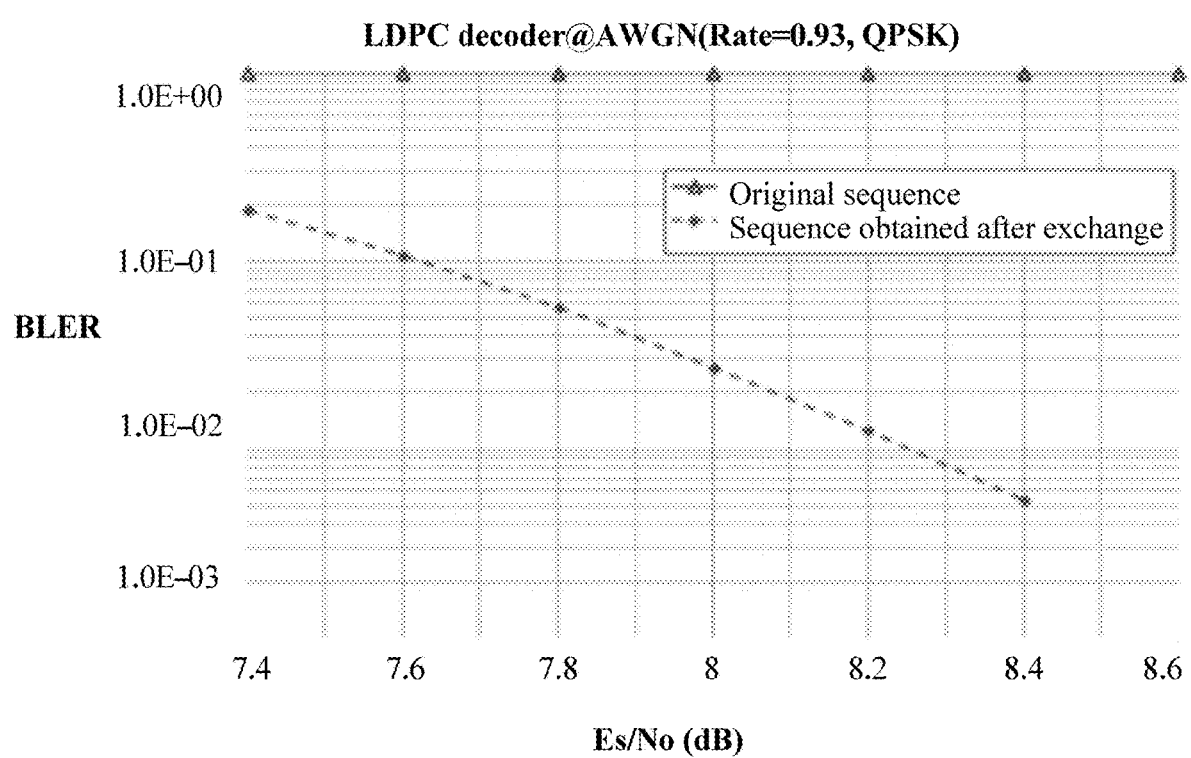
FIG. 8 is a schematic diagram of performance according to another embodiment of the present invention.

According to the information processing method in this embodiment of the present invention, parity bits is punctured to obtain a relatively high code rate. For processing an encoded bit sequence, puncturing a parity check column is considered. Therefore, bit groups corresponding to these columns are permutated, so that entries to be punctured in each row are reduced, thereby meeting performance requirement of an LDPC code at a high code rate. FIG. 8 is a schematic diagram of performance contrast before and after permutation when an input sequence has a length of 512 and an LDPC matrix of the base graph 30*a* has a code rate of 0.93. An "original sequence" is a performance curve of the LDPC matrix of the base graph 30*a* at different Es/No when a punctured parity check column is not permutated. It can be learned that when a BLER of the LDPC matrix is 1, the LDPC matrix cannot normally work. However, a "sequence obtained after exchange" is a performance curve of the LDPC matrix of the base graph 30*a* at different Es/No ratios

TABLE 8

| Permutation sequence P(j), 0 ≤ j < n | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| | 17 | 18 | 19 | 20 | 21 | P(a) | P(a + 1) | P(a + 2) | P(a + 3) | P(a + 4) | P(a + 5) | 28 | 29 | 30 | 31 | 32 | 33 |
| | 34 | 35 | 36 | 37 | 38 | 39 | 40 | 41 | 42 | 43 | 44 | 45 | 46 | 47 | 48 | 49 | 50 |
| | 51 | 52 | 53 | 54 | 55 | 56 | 57 | 58 | 59 | 60 | 61 | 62 | 63 | 64 | 65 | 66 | 67 |

In the foregoing implementation, if the permutation sequence shown in Table 8 is used, a bit (2*Z) in the bit sequence V may be used as a starting position during initial transmission to obtain an output bit sequence E. That is, the group 0 of bits and the group 1 of bits are skipped, and in this case, the two groups of bits corresponding to the built-in puncture column may still be obtained during retransmission.

In one embodiment, the two groups of bits corresponding to the built-in puncture column in the bit sequence D are directly discarded. Therefore, a permutation sequence is shown in Table 9, and in a sequence of from left to right and from up to down, Table 9 shows an example in which each group of bits in the bit sequence V correspond to a group P(j) of bits in the bit sequence D. For example, the group 0 of bits in the bit sequence V are the group 2 of bits in the bit sequence D, the group 1 of bits in the bit sequence V are the group 3 of bits in the bit sequence D, and by analogy, details are not described again. The group 20 of bits are P(a) in the bit sequence, that is, a=20. The group 65 of bits are the group 67 of bits in the bit sequence D. $\{P(a+i)|0\leq i<6\}$ may be any group of possible value combinations in Table 1 to Table 6.

after the punctured parity check column is permutated according to the information processing method provided in this embodiment of the present invention. It can be learned that at a same Es/No ratio, a decrease in the BLER indicates better performance.

Figure 6:
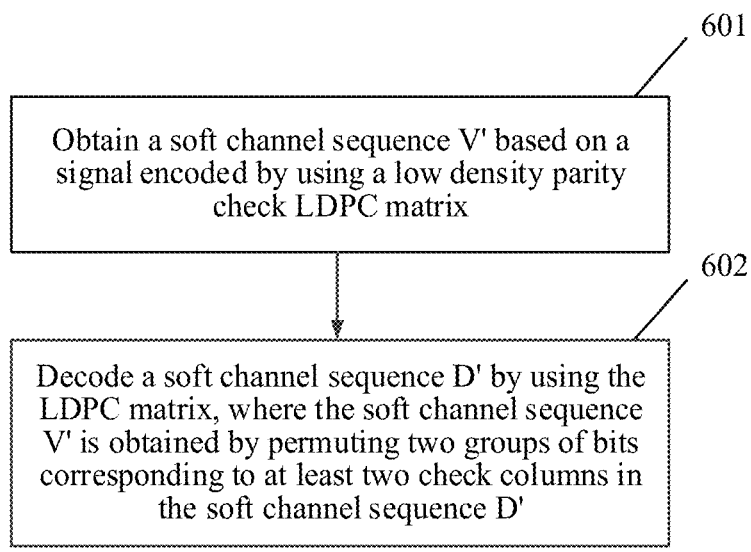
FIG. 6 is a flowchart of an information processing method according to another embodiment of the present invention.

FIG. 6 shows an information processing method according to another embodiment of the present invention. The method includes the following steps.

601: Obtain a signal encoded based on a low density parity check LDPC matrix.

In a communications system 400, a communications device 41 is used as a communications device of a receive end, and obtains a signal that is sent by a communications device 40 and that is encoded based on the LDPC matrix.

602: Obtain a soft value sequence V based on the signal.

The communications device 40 sends, to the communications device 41, the output bit sequence obtained in the foregoing embodiments. It may be understood that: the output bit sequence in the foregoing embodiments is an output bit sequence obtained after rate matching; the communications device 40 may perform processing such as interleaving and modulation on the output bit sequence obtained after rate matching, to send a sending signal

TABLE 9

| Permutation sequence P(j), 0 ≤ j < n | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|
| | 19 | 20 | 21 | P(a) | P(a + 1) | P(a + 2) | P(a + 3) | P(a + 4) | P(a + 5) | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 |
| | 53 | 54 | 55 | 56 | 57 | 58 | 59 | 60 | 61 | 62 | 63 | 64 | 65 | 66 | 67 | | |

In the foregoing implementation, if the permutation sequence shown in Table 9 is used, and the bit 0 in the bit sequence V may be used as a starting position during initial transmission to obtain an output bit sequence E. Because the two groups of bits corresponding to the built-in puncture column are discarded, regardless of whether in the initial transmission or the retransmission, the output bit sequence does not include the two groups of bits corresponding to the corresponding to the output bit sequence; and the communications device 41 receives the output signal and obtains a soft value sequence corresponding to the output bit sequence after demodulation and de-interleaving. That is, a bit in the output bit sequence corresponds to a soft channel bit (soft channel bit) in the soft value sequence. Locations of the soft channel bits stored in a soft information buffer of the communications device 41 and locations of code blocks in a circular buffer of the communications device 40 are in one-to-one correspondence. A size of the soft information buffer and a size of the code block in the circular buffer are also the same and may be $N_{CB}$.

For example, an output bit sent by the communications device 40 is 1, and after channel transmission, the communications device 41 obtains a soft channel bit corresponding to the output bit, that is, 1.45; and if a location of the output bit in the code block is the bit 5, the bit 5 soft channel bit in the soft information buffer of the communications device 41 is 1.45. It should be noted that only an example is provided herein for description, and this embodiment of the present invention is not limited thereto. If the output bit sequence obtained by the communications device 40 includes n output bits, the communications device 41 may obtain n corresponding soft channel bits. If the communications device 41 receives soft channel bits twice at a same position, soft values of the soft channel bits received twice are combined. For example, if a soft channel bit received in a first transmission is 1.45 and a soft channel bit received in a second transmission is 0.5, 1.95 is obtained after combination. It should be noted that only an example is provided herein, and the present invention is not limited thereto.

The communications device 41 obtains the soft value sequence V after performing demodulation and the like on the signal obtained in 601. A bit in the bit sequence V corresponds to a soft channel bit (soft channel bit) in the soft value sequence V'.

603: Decode the soft value sequence D' by using the LDPC matrix.

A base matrix of the LDPC matrix is represented by a matrix of m rows and n columns, each column corresponds to a group of Z continuous soft channel bits in the soft value sequence D', and both n and Z are integers greater than 0.

A group j of Z continuous soft channel bits in the soft value sequence V' are a group P(j) of Z continuous soft channel bits in the soft value sequence D', j is an integer, and 0≤j<n.

The soft value sequence V is obtained by permuting two groups of bits corresponding to at least two parity check columns in the soft value sequence D', and the at least two parity check columns are at least two columns of a column (n−m) to a column (n−1) of the base matrix.

It can be learned that, positions of permutated parity check columns have corresponding features of the foregoing embodiments. For the features, refer to the descriptions of the foregoing embodiments, and details are not described herein again. However, in the communications device 41, the soft value sequence V' and the soft value sequence D' are described, and in the communications device 40, the bit sequence V and the bit sequence D are described.

Figure 7:
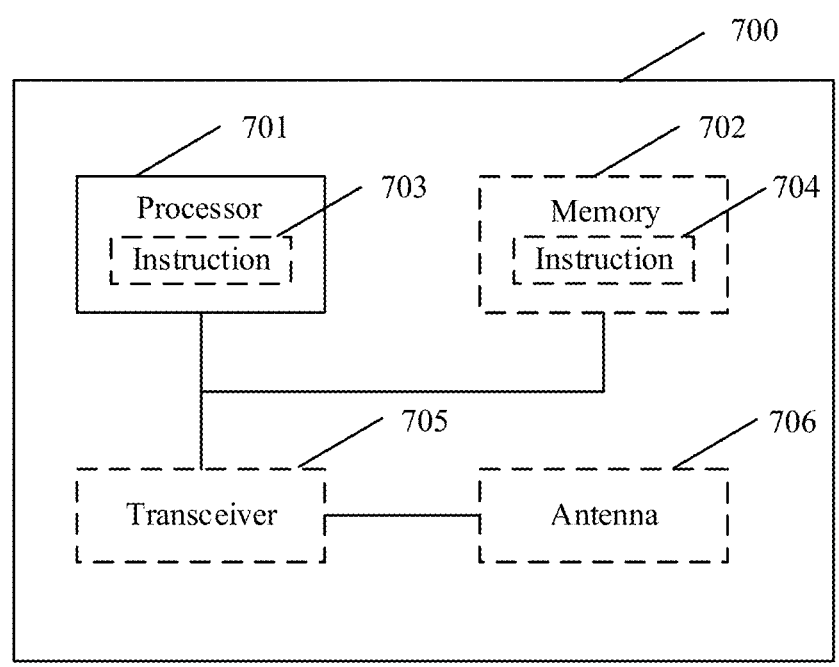
FIG. 7 is a schematic structural diagram of an information processing apparatus according to another embodiment of the present invention.

FIG. 7 is a schematic structural diagram of a communications apparatus 700. The communications apparatus 700 can be configured to implement the methods described in the foregoing method embodiments. For details, refer to the descriptions of the foregoing method embodiments. The communications apparatus 700 may be a chip, a base station, a terminal, or another network device.

The communications apparatus 700 includes one or more processors 701. The processor 701 may be a general-purpose processor, a special-purpose processor, or the like. For example, the processor 701 may be a baseband processor or a central processing unit. The baseband processor may be configured to perform processing on a communication protocol and communication data, and the central processor may be configured to control the communications apparatus (for example, the base station, the terminal, or the chip), to execute a software program and process data of the software program.

In one embodiment, the communications apparatus 700 includes one or more processors 701, and the one or more processors 701 can implement the method in the method embodiment shown in FIG. 5. In one embodiment, in addition to implementing the method in the method embodiment shown in FIG. 5, the processor 701 can further implement other functions.

The communications apparatus 700 encodes an input sequence by using a low density parity check LDPC matrix to obtain a bit sequence D, where a base matrix of the LDPC matrix is represented by a matrix of m rows and n columns, each column corresponds to a group of Z continuous bits in the bit sequence D, and both n and Z are integers greater than 0; and obtains an output bit sequence based on a bit sequence V, where the bit sequence V is obtained by permuting two groups of bits corresponding to at least two parity check columns in the bit sequence D, the at least two parity check columns are at least two columns of a column (n−m) to a column (n−1) of the base matrix, a group j of Z continuous bits in the bit sequence V are a group P(j) of Z continuous bits in the bit sequence D, j is an integer, and 0≤j<n.

In one embodiment, the one or more processors 701 can implement the method in the method embodiment shown in FIG. 6. In one embodiment, in addition to implementing the method in method embodiment shown in FIG. 6, the processor 701 can further implement other functions.

The communications apparatus 700 can be configured to obtain a soft value sequence V based on a signal encoded by using a low density parity check LDPC matrix; and decode a soft value sequence D' by using the LDPC matrix, where a base matrix of the LDPC matrix is represented by a matrix of m rows and n columns, each column corresponds to a group of Z continuous soft channel bits in the soft value sequence D', and both n and Z are integers greater than 0; a group j of Z continuous soft channel bits in the soft value sequence V are a group P(j) of Z continuous soft channel bits in the soft value sequence D', j is an integer, and 0≤j<n; and the soft value sequence V' is obtained by permuting two groups of bits corresponding to at least two parity check columns in the soft value sequence D', and the at least two parity check columns are at least two columns of a column (n−m) to a column (n−1) of the base matrix.

In one embodiment, the processor 701 may also include instructions 703, and the instructions may be run on the processor, so that the communications apparatus 700 performs the methods described in the foregoing method embodiments.

In one embodiment, the communications apparatus 700 may also include a circuit, and the circuit may implement the methods in the foregoing method embodiments.

In one embodiment, the communications apparatus 700 may include one or more memories 702, and instructions 704 are stored in the memories. The instructions may be run on the processor, so that the communications apparatus 700 performs the methods described in the foregoing method embodiments. In one embodiment, the memory may further store data. In one embodiment, the processor may also store instructions and/or data. The processor and the memory may be separately disposed or may be integrated together. In one embodiment, the one or more memories 702 may store a base matrix-related parameter, for example, a shift value, a base graph, a matrix obtained by lifting a base graph, rows in the base matrix, a lifting factor, and the like. In one embodiment, the one or more memories 702 may store the base matrix or the matrix obtained by lifting a base matrix.

In one embodiment, the communications apparatus 700 may further include a transceiver 705 and an antenna 706. The processor 701 may be referred to as a processing unit to control the communications apparatus (the terminal or the base station). The transceiver 705 may be referred to as a transceiver unit, a transceiver machine, a transceiver circuit, and the like, and configured to implement a receiving and sending function of the communications apparatus by using the antenna 706.

In one embodiment, the communications apparatus 700 may further include a device configured to generate a transmission block CRC, a device used for code block segmentation and CRC check, an interleaver used for interleaving, a modulator used for modulation, and the like. Functions of the devices may be implemented by using one or more processors 701.

In one embodiment, the communications apparatus 700 may further include a demodulator used for a demodulation operation, a de-interleaver used for de-interleaving, a device used for rate de-matching, or the like. Functions of the devices may be implemented by using one or more processors 701.

A person skilled in the art may further understand that various illustrative logical blocks and steps that are listed in the embodiments of the present invention may be implemented by using electronic hardware, computer software, or a combination thereof. Whether the functions are implemented by using hardware or software depends on particular applications and a design requirement of the entire system. A person of ordinary skill in the art may use various methods to implement the described functions for each particular application, but it should not be considered that the implementation goes beyond the scope of the embodiments of the present invention.

The various illustrative logical units and circuits described in the embodiments of the present invention may implement or operate the described functions by using a general processor, a digital signal processor, an application-specific integrated circuit (ASIC), a field programmable gate array (FPGA) or another programmable logical apparatus, a discrete gate or transistor logic, a discrete hardware component, or a design of any combination thereof. The general processor may be a microprocessor. In one embodiment, the general processor may also be any traditional processor, controller, microcontroller, or state machine. The processor may also be implemented by a combination of computing apparatuses, such as a digital signal processor and a microprocessor, multiple microprocessors, one or more microprocessors with a digital signal processor core, or any other similar configuration.

Steps of the methods or algorithms described in the embodiments of the present invention may be directly embedded into hardware, instructions executed by a processor, or a combination thereof. The memory may be a RAM memory, a flash memory, a ROM memory, an EPROM memory, an EEPROM memory, a register, a hard disk, a removable magnetic disk, a CD-ROM, or a storage medium of any other form in the art. For example, the memory may connect to a processor so that the processor may read information from the memory and write information to the memory. Alternatively, the memory may further be integrated into a processor. The processor and the memory may be arranged in an ASIC, and the ASIC may be arranged in UE. In one embodiment, the processor and the memory may be arranged in different components of the UE.

With descriptions of the foregoing embodiments, a person skilled in the art may clearly understand that the present invention may be implemented by hardware, firmware or a combination thereof. When the present invention is implemented by using a software program, the present invention may be fully or partially implemented in a form of a computer program product, and the computer program product includes one or more computer instructions. When the computer instructions are loaded and executed on the computer, the procedure or functions according to the embodiments of the present invention are all or partially generated. When the present invention is implemented by a software program, the foregoing functions may be stored in a computer-readable medium or transmitted as one or more instructions or code in the computer-readable medium. The computer may be a general-purpose computer, a dedicated computer, a computer network, or other programmable apparatuses. The computer instruction may be stored in a computer readable storage medium or transmitted from a computer readable storage medium to another computer readable storage medium. The computer-readable medium includes a computer storage medium and a communications medium, where the communications medium includes any medium that enables a computer program to be transmitted from one place to another. The storage medium may be any available medium accessible to a computer. The following provides an example but does not impose a limitation: The computer-readable medium may include a RAM, a ROM, an EEPROM, a CD-ROM, or another optical disc storage or disk storage medium, or another magnetic storage device, or any other medium that can carry or store expected program code in a form of an instruction or a data structure and can be accessed by a computer. In addition, any connection may be appropriately defined as a computer-readable medium. For example, if software is transmitted from a web site, a server or another remote source by using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in fixation of a medium to which they belong. For example, a disk (Disk) and disc (disc) used by the present invention includes a compact disc CD, a laser disc, an optical disc, a digital versatile disc (DVD), a floppy disk and a Blu-ray disc, where the disk generally copies data by a magnetic means, and the disc copies data optically by a laser means. The foregoing combination should also be included in the protection scope of the computer-readable medium.

In summary, what is described above is merely example embodiments of the technical solutions of the present invention, but is not intended to limit the protection scope of the present invention. Any modification, equivalent replacement, or improvement made without departing from the spirit and principle of the present invention shall fall within the protection scope of the present invention.

What is claimed is:

1. A method of channel encoding in a communications system, the method comprising:
   encoding, by a terminal of the communications system, an input sequence by using a low density parity check (LDPC) matrix to obtain a bit sequence D, wherein the input sequence is control information or data information to be sent from the terminal to a base station of the communications system, wherein a base matrix of the LDPC matrix is represented by a matrix of m rows and n columns, wherein each column corresponds to a group of Z continuous bits in the bit sequence D, and wherein both n and Z are integers greater than 0;

obtaining, by the terminal, a bit sequence V by permuting groups of bits corresponding to at least two parity check columns in the bit sequence D, wherein the at least two parity check columns are at least two columns of a column (n−m) to a column (n−1) of the base matrix, wherein a group j of Z continuous bits in the bit sequence V are a group P(j) of Z continuous bits in the bit sequence D, and wherein j is an integer that is smaller than n and greater than or equal to 0; and obtaining, by the terminal, an output bit sequence based on the bit sequence V.

2. The method according to claim 1, wherein the at least two parity check columns are at least two columns in {P(a+i)|0≤i<6} of the base matrix, wherein {P(a+i)|0≤i<6}={22, 23, 24, 25, 26, 27}; and wherein the bit sequence V is obtained by permuting at least two groups of Z continuous bits in {P(a+i)|0≤i<6} in the bit sequence D.

3. The method according to claim 1, wherein $P(a+5)=26, P(a+4)=27;$ $P(a+5)=27, P(a+4)=26;$ $P(a+5)=25, P(a+4)=26;$ $P(a+5)=26, P(a+4)=25;$ $P(a+5)=25, P(a+4)=27;$ or $P(a+5)=27, P(a+4)=25.$ 4. The method according to claim 2, wherein a=20 or a=22.

5. The method according to claim 2, wherein {P(a+i)|0≤i<6} comprises any group of values in the following:
{22, 23, 24, 25, 26, 27}, {22, 23, 25, 24, 26, 27}, {22, 24, 23, 25, 26, 27}, {22, 24, 25, 23, 26, 27}, {22, 25, 23, 24, 26, 27}, {22, 25, 24, 23, 26, 27}, {23, 22, 24, 25, 26, 27}, {23, 22, 25, 24, 26, 27}, {23, 24, 22, 25, 26, 27}, {23, 24, 25, 22, 26, 27}, {23, 25, 22, 24, 26, 27}, {23, 25, 24, 22, 26, 27}, {24, 22, 23, 25, 26, 27}, {24, 22, 25, 23, 26, 27}, {24, 23, 22, 25, 26, 27}, {24, 23, 25, 22, 26, 27}, {24, 25, 22, 23, 26, 27}, {24, 25, 23, 22, 26, 27}, {25, 22, 23, 24, 26, 27}, {25, 22, 24, 23, 26, 27}, {25, 23, 22, 24, 26, 27}, {25, 23, 24, 22, 26, 27}, {25, 24, 22, 23, 26, 27}, {25, 24, 23, 22, 26, 27}.

6. The method according to claim 2, wherein {P(a+i)|0≤i<6} comprises any group of values in the following:
{22, 23, 24, 25, 27, 26}, {22, 23, 25, 24, 27, 26}, {22, 24, 23, 25, 27, 26}, {22, 24, 25, 23, 27, 26}, {22, 25, 23, 24, 27, 26}, {22, 25, 24, 23, 27, 26}, {23, 22, 24, 25, 27, 26}, {23, 22, 25, 24, 27, 26}, {23, 24, 22, 25, 27, 26}, {23, 24, 25, 22, 27, 26}, {23, 25, 22, 24, 27, 26}, {23, 25, 24, 22, 27, 26}, {24, 22, 23, 25, 27, 26}, {24, 22, 25, 23, 27, 26}, {24, 23, 22, 25, 27, 26}, {24, 23, 25, 22, 27, 26}, {24, 25, 22, 23, 27, 26}, {24, 25, 23, 22, 27, 26}, {25, 22, 23, 24, 27, 26}, {25, 22, 24, 23, 27, 26}, {25, 23, 22, 24, 27, 26}, {25, 23, 24, 22, 27, 26}, {25, 24, 22, 23, 27, 26}, {25, 24, 23, 22, 27, 26}.

7. The method according to claim 2, wherein {P(a+i)|0≤i<6} comprises any group of values in the following:
{22, 23, 24, 27, 25, 26}, {22, 23, 27, 24, 25, 26}, {22, 24, 23, 27, 25, 26}, {22, 24, 27, 23, 25, 26}, {22, 27, 23, 24, 25, 26}, {22, 27, 24, 23, 25, 26}, {23, 22, 24, 27, 25, 26}, {23, 22, 27, 24, 25, 26}, {23, 24, 22, 27, 25, 26}, {23, 24, 27, 22, 25, 26}, {23, 27, 22, 24, 25, 26}, {23, 27, 24, 22, 25, 26}, {24, 22, 23, 27, 25, 26}, {24, 22, 27, 23, 25, 26}, {24, 23, 22, 27, 25, 26}, {24, 23, 27, 22, 25, 26}, {24, 27, 22, 23, 25, 26}, {24, 27, 23, 22, 25, 26}, {27, 22, 23, 24, 25, 26}, {27, 22, 24, 23, 25, 26}, {27, 23, 22, 24, 25, 26}, {27, 23, 24, 22, 25, 26}, {27, 24, 22, 23, 25, 26}, {27, 24, 23, 22, 25, 26}.

8. The method according to claim 2, wherein {P(a+i)|0≤i<6} comprises any group of values in the following:
{22, 23, 24, 27, 26, 25}, {22, 23, 27, 24, 26, 25}, {22, 24, 23, 27, 26, 25}, {22, 24, 27, 23, 26, 25}, {22, 27, 23, 24, 26, 25}, {22, 27, 24, 23, 26, 25}, {23, 22, 24, 27, 26, 25}, {23, 22, 27, 24, 26, 25}, {23, 24, 22, 27, 26, 25}, {23, 24, 27, 22, 26, 25}, {23, 27, 22, 24, 26, 25}, {23, 27, 24, 22, 26, 25}, {24, 22, 23, 27, 26, 25}, {24, 22, 27, 23, 26, 25}, {24, 23, 22, 27, 26, 25}, {24, 23, 27, 22, 26, 25}, {24, 27, 22, 23, 26, 25}, {24, 27, 23, 22, 26, 25}, {27, 22, 23, 24, 26, 25}, {27, 22, 24, 23, 26, 25}, {27, 23, 22, 24, 26, 25}, {27, 23, 24, 22, 26, 25}, {27, 24, 22, 23, 26, 25}, {27, 24, 23, 22, 26, 25}.

9. The method according to claim 2, wherein {P(a+i)|0≤i<6} comprises any group of values in the following:
{22, 23, 24, 26, 25, 27}, {22, 23, 26, 24, 25, 27}, {22, 24, 23, 26, 25, 27}, {22, 24, 26, 23, 25, 27}, {22, 26, 23, 24, 25, 27}, {22, 26, 24, 23, 25, 27}, {23, 22, 24, 26, 25, 27}, {23, 22, 26, 24, 25, 27}, {23, 24, 22, 26, 25, 27}, {23, 24, 26, 22, 25, 27}, {23, 26, 22, 24, 25, 27}, {23, 26, 24, 22, 25, 27}, {24, 22, 23, 26, 25, 27}, {24, 22, 26, 23, 25, 27}, {24, 23, 22, 26, 25, 27}, {24, 23, 26, 22, 25, 27}, {24, 26, 22, 23, 25, 27}, {24, 26, 23, 22, 25, 27}, {26, 22, 23, 24, 25, 27}, {26, 22, 24, 23, 25, 27}, {26, 23, 22, 24, 25, 27}, {26, 23, 24, 22, 25, 27}, {26, 24, 22, 23, 25, 27}, {26, 24, 23, 22, 25, 27}.

10. The method according to claim 2, wherein {P(a+i)|0≤i<6} comprises any group of values in the following:
{22, 23, 24, 26, 27, 25}, {22, 23, 26, 24, 27, 25}, {22, 24, 23, 26, 27, 25}, {22, 24, 26, 23, 27, 25}, {22, 26, 23, 24, 27, 25}, {22, 26, 24, 23, 27, 25}, {23, 22, 24, 26, 27, 25}, {23, 22, 26, 24, 27, 25}, {23, 24, 22, 26, 27, 25}, {23, 24, 26, 22, 27, 25}, {23, 26, 22, 24, 27, 25}, {23, 26, 24, 22, 27, 25}, {24, 22, 23, 26, 27, 25}, {24, 22, 26, 23, 27, 25}, {24, 23, 22, 26, 27, 25}, {24, 23, 26, 22, 27, 25}, {24, 26, 22, 23, 27, 25}, {24, 26, 23, 22, 27, 25}, {26, 22, 23, 24, 27, 25}, {26, 22, 24, 23, 27, 25}, {26, 23, 22, 24, 27, 25}, {26, 23, 24, 22, 27, 25}, {26, 24, 22, 23, 27, 25}, {26, 24, 23, 22, 27, 25}.

11. The method according to claim 2, wherein obtaining the output bit sequence based on the bit sequence V comprises:

when a=20, obtaining the output bit sequence by using a bit 0 of the bit sequence V as a starting position; or when a=20, obtaining the output bit sequence by using the bit 0 of the bit sequence V as a starting position, wherein the output bit sequence does not comprise the group 0 of bits and the group 1 of bits in the bit sequence D; or when a=22, obtaining the output bit sequence by using a bit (2*Z) of the bit sequence V as a starting position.

12. An apparatus, comprising:

a processor; and a non-transitory computer-readable storage medium coupled to the processor and storing programming instructions for channel encoding in a communications system, the programming instructions, when executed by the processor, causing the processor to:

encode an input sequence by using a low density parity check (LDPC) matrix to obtain a bit sequence D, wherein the input sequence is control information or data information to be sent from a terminal to a base station of the communications system, wherein a base matrix of the LDPC matrix is represented by a matrix of m rows and n columns, wherein each column corresponds to a group of Z continuous bits in the bit sequence D, and wherein both n and Z are integers greater than 0; obtain a bit sequence V by permuting groups of bits corresponding to at least two parity check columns in the bit sequence D, wherein the at least two parity check columns are at least two columns of a column (n−m) to a column (n−1) of the base matrix, wherein a group j of Z continuous bits in the bit sequence V are a group P(j) of Z continuous bits in the bit sequence D, and wherein j is an integer that is smaller than n and greater than or equal to 0; and obtaining an output bit sequence based on the bit sequence V.

13. The apparatus according to claim 12, wherein the at least two parity check columns are at least two columns in {P(a+i)|0≤i<6} of the base matrix, wherein {P(a+i)|0≤i<6}={22, 23, 24, 25, 26, 27}; and wherein the bit sequence V is obtained by permuting at least two groups of Z continuous bits in {P(a+i)|0≤i<6} in the bit sequence D.

14. The apparatus according to claim 12, wherein $P(a+5)=26, P(a+4)=27;$ $P(a+5)=27, P(a+4)=26;$ $P(a+5)=25, P(a+4)=26;$ $P(a+5)=26, P(a+4)=25;$ $P(a+5)=25, P(a+4)=27;$ or $P(a+5)=27, P(a+4)=25.$ 15. The apparatus according to claim 13, wherein a=20 or a=22.

16. The apparatus according to claim 13, wherein {P(a+i)|0≤i<6} comprises any group of values in the following: {22, 23, 24, 25, 26, 27}, {22, 23, 25, 24, 26, 27}, {22, 24, 23, 25, 26, 27}, {22, 24, 25, 23, 26, 27}, {22, 25, 23, 24, 26, 27}, {22, 25, 24, 23, 26, 27}, {23, 22, 24, 25, 26, 27}, {23, 22, 25, 24, 26, 27}, {23, 24, 22, 25, 26, 27}, {23, 24, 25, 22, 26, 27}, {23, 25, 22, 24, 26, 27}, {23, 25, 24, 22, 26, 27}, {24, 22, 23, 25, 26, 27}, {24, 22, 25, 23, 26, 27}, {24, 23, 22, 25, 26, 27}, {24, 23, 25, 22, 26, 27}, {24, 25, 22, 23, 26, 27}, {24, 25, 23, 22, 26, 27}, {25, 22, 23, 24, 26, 27}, {25, 22, 24, 23, 26, 27}, {25, 23, 22, 24, 26, 27}, {25, 23, 24, 22, 26, 27}, {25, 24, 22, 23, 26, 27}, {25, 24, 23, 22, 26, 27}.

17. The apparatus according to claim 13, wherein {P(a+i)|0≤i<6} comprises any group of values in the following: {22, 23, 24, 25, 27, 26}, {22, 23, 25, 24, 27, 26}, {22, 24, 23, 25, 27, 26}, {22, 24, 25, 23, 27, 26}, {22, 25, 23, 24, 27, 26}, {22, 25, 24, 23, 27, 26}, {23, 22, 24, 25, 27, 26}, {23, 22, 25, 24, 27, 26}, {23, 24, 22, 25, 27, 26}, {23, 24, 25, 22, 27, 26}, {23, 25, 22, 24, 27, 26}, {23, 25, 24, 22, 27, 26}, {24, 22, 23, 25, 27, 26}, {24, 22, 25, 23, 27, 26}, {24, 23, 22, 25, 27, 26}, {24, 23, 25, 22, 27, 26}, {24, 25, 22, 23, 27, 26}, {24, 25, 23, 22, 27, 26}, {25, 22, 23, 24, 27, 26}, {25, 22, 24, 23, 27, 26}, {25, 23, 22, 24, 27, 26}, {25, 23, 24, 22, 27, 26}, {25, 24, 22, 23, 27, 26}, {25, 24, 23, 22, 27, 26}.

18. The apparatus according to claim 13, wherein {P(a+i)|0≤i<6} comprises any group of values in the following: {22, 23, 24, 27, 25, 26}, {22, 23, 27, 24, 25, 26}, {22, 24, 23, 27, 25, 26}, {22, 24, 27, 23, 25, 26}, {22, 27, 23, 24, 25, 26}, {22, 27, 24, 23, 25, 26}, {23, 22, 24, 27, 25, 26}, {23, 22, 27, 24, 25, 26}, {23, 24, 22, 27, 25, 26}, {23, 24, 27, 22, 25, 26}, {23, 27, 22, 24, 25, 26}, {23, 27, 24, 22, 25, 26}, {24, 22, 23, 27, 25, 26}, {24, 22, 27, 23, 25, 26}, {24, 23, 22, 27, 25, 26}, {24, 23, 27, 22, 25, 26}, {24, 27, 22, 23, 25, 26}, {24, 27, 23, 22, 25, 26}, {27, 22, 23, 24, 25, 26}, {27, 22, 24, 23, 25, 26}, {27, 23, 22, 24, 25, 26}, {27, 23, 24, 22, 25, 26}, {27, 24, 22, 23, 25, 26}, {27, 24, 23, 22, 25, 26}.

19. The apparatus according to claim 13, wherein {P(a+i)|0≤i<6} comprises any group of values in the following: {22, 23, 24, 27, 26, 25}, {22, 23, 27, 24, 26, 25}, {22, 24, 23, 27, 26, 25}, {22, 24, 27, 23, 26, 25}, {22, 27, 23, 24, 26, 25}, {22, 27, 24, 23, 26, 25}, {23, 22, 24, 27, 26, 25}, {23, 22, 27, 24, 26, 25}, {23, 24, 22, 27, 26, 25}, {23, 24, 27, 22, 26, 25}, {23, 27, 22, 24, 26, 25}, {23, 27, 24, 22, 26, 25}, {24, 22, 23, 27, 26, 25}, {24, 22, 27, 23, 26, 25}, {24, 23, 22, 27, 26, 25}, {24, 23, 27, 22, 26, 25}, {24, 27, 22, 23, 26, 25}, {24, 27, 23, 22, 26, 25}, {27, 22, 23, 24, 26, 25}, {27, 22, 24, 23, 26, 25}, {27, 23, 22, 24, 26, 25}, {27, 23, 24, 22, 26, 25}, {27, 24, 22, 23, 26, 25}, {27, 24, 23, 22, 26, 25}.

20. The apparatus according to claim 13, wherein {P(a+i)|0≤i<6} comprises any group of values in the following: {22, 23, 24, 26, 25, 27}, {22, 23, 26, 24, 25, 27}, {22, 24, 23, 26, 25, 27}, {22, 24, 26, 23, 25, 27}, {22, 26, 23, 24, 25, 27}, {22, 26, 24, 23, 25, 27}, {23, 22, 24, 26, 25, 27}, {23, 22, 26, 24, 25, 27}, {23, 24, 22, 26, 25, 27}, {23, 24, 26, 22, 25, 27}, {23, 26, 22, 24, 25, 27}, {23, 26, 24, 22, 25, 27}, {24, 22, 23, 26, 25, 27}, {24, 22, 26, 23, 25, 27}, {24, 23, 22, 26, 25, 27}, {24, 23, 26, 22, 25, 27}, {24, 26, 22, 23, 25, 27}, {24, 26, 23, 22, 25, 27}, {26, 22, 23, 24, 25, 27}, {26, 22, 24, 23, 25, 27}, {26, 23, 22, 24, 25, 27}, {26, 23, 24, 22, 25, 27}, {26, 24, 22, 23, 25, 27}, {26, 24, 23, 22, 25, 27}.

21. The apparatus according to claim 13, wherein {P(a+i)|0≤i<6} comprises any group of values in the following: {22, 23, 24, 26, 27, 25}, {22, 23, 26, 24, 27, 25}, {22, 24, 23, 26, 27, 25}, {22, 24, 26, 23, 27, 25}, {22, 26, 23, 24, 27, 25}, {22, 26, 24, 23, 27, 25}, {23, 22, 24, 26, 27, 25}, {23, 22, 26, 24, 27, 25}, {23, 24, 22, 26, 27, 25}, {23, 24, 26, 22, 27, 25}, {23, 26, 22, 24, 27, 25}, {23, 26, 24, 22, 27, 25}, {24, 22, 23, 26, 27, 25}, {24, 22, 26, 23, 27, 25}, {24, 23, 22, 26, 27, 25}, {24, 23, 26, 22, 27, 25}, {24, 26, 22, 23, 27, 25}, {24, 26, 23, 22, 27, 25}, {26, 22, 23, 24, 27, 25}, {26, 22, 24, 23, 27, 25}, {26, 23, 22, 24, 27, 25}, {26, 23, 24, 22, 27, 25}, {26, 24, 22, 23, 27, 25}, {26, 24, 23, 22, 27, 25}.

22. The apparatus according to claim 13, the programming instructions instruct the processor to:

in case of a=20, obtain the output bit sequence by using a bit 0 of the bit sequence V as a starting position; or in case of a=20, obtain the output bit sequence by using the bit 0 of the bit sequence V as a starting position, wherein the output bit sequence does not comprise the group 0 of bits and the group 1 of bits in the bit sequence D; or in case of a=22, obtain the output bit sequence by using a bit (2*Z) of the bit sequence V as a starting position.

* * * * *